US010047558B2

(12) United States Patent
Hummel et al.

(10) Patent No.: US 10,047,558 B2
(45) Date of Patent: Aug. 14, 2018

(54) RETRACTABLE FLEXIBLE-PANEL DOOR

(71) Applicant: ODL, Incorporated, Zeeland, MI (US)

(72) Inventors: Benjamin Patrick Hummel, Rockford, MI (US); Sorin Ciobanu, Holland, MI (US); Raymond Edward Hartnett, Holland, MI (US)

(73) Assignee: ODL, Incorporated, Zeeland, MI (US)

( * ) Notice: Subject to any disclaimer, the term of this patent is extended or adjusted under 35 U.S.C. 154(b) by 0 days.

(21) Appl. No.: 15/455,841

(22) Filed: Mar. 10, 2017

(65) Prior Publication Data

US 2017/0183907 A1 Jun. 29, 2017

Related U.S. Application Data

(63) Continuation of application No. 14/763,214, filed as application No. PCT/US2014/019609 on Feb. 28, 2014, now Pat. No. 9,624,722.

(Continued)

(51) Int. Cl.

| | |
|---|---|
| ***E06B 9/54*** | (2006.01) |
| ***E06B 3/80*** | (2006.01) |
| ***E06B 9/24*** | (2006.01) |
| ***E06B 9/52*** | (2006.01) |
| ***E06B 9/58*** | (2006.01) |
| ***E06B 9/78*** | (2006.01) |

(52) U.S. Cl.

CPC .................. *E06B 9/54* (2013.01); *E06B 3/80* (2013.01); *E06B 9/24* (2013.01); *E06B 9/52* (2013.01); *E06B 9/58* (2013.01); *E06B 9/78* (2013.01); *H05K 999/99* (2013.01); *E06B 2009/524* (2013.01); *E06B 2009/527* (2013.01); *E06B 2009/543* (2013.01)

(58) Field of Classification Search

CPC ..... E06B 9/52; E06B 9/54; E06B 9/58; E06B 2009/543; E06B 3/80; E06B 2009/527

See application file for complete search history.

(56) References Cited

U.S. PATENT DOCUMENTS

| | | |
|---|---|---|
| 1,109,744 A | 9/1914 | Emery |
| 2,037,629 A | 4/1936 | Holgate |

(Continued)

FOREIGN PATENT DOCUMENTS

| | | |
|---|---|---|
| EP | 0790384 B1 | 5/2002 |
| EP | 1158135 A1 | 11/2011 |
| KR | 10-2010-0076765 A | 7/2010 |

OTHER PUBLICATIONS

PCT Search Report and Written Opinion for PCT/US2014/019609, completed Jun. 3, 2014.

*Primary Examiner* — Katherine W Mitchell
*Assistant Examiner* — Johnnie A. Shablack
(74) *Attorney, Agent, or Firm* — Barnes & Thornburg LLP

(57) ABSTRACT

A retractable, flexible-panel door is mountable to a door frame attached to a building and includes a first side rail, a second side rail, a top rail mountable to and between the first and second side rails, and a bottom rail mountable to and between the first and second side rails. A flexible panel extends between the top and bottom rails, and at least one biasing member draws the flexible panel toward one of the first and second side rails. The top and bottom rails are each axially expandable and reducible in length to accommodate mounting of the retractable, flexible panel door to door frames of different widths.

20 Claims, 20 Drawing Sheets

Related U.S. Application Data

(60) Provisional application No. 61/770,567, filed on Feb. 28, 2013.

(56) References Cited

U.S. PATENT DOCUMENTS

| | | | | | |
|---|---|---|---|---|---|
| RE23,603 | E | | 12/1952 | Rohs et al. | |
| 2,817,371 | A | | 12/1957 | Bussiere | |
| 3,417,794 | A | | 12/1968 | Lynch et al. | |
| 4,002,188 | A | | 1/1977 | Hanks | |
| 4,197,345 | A | | 4/1980 | Worrall | |
| 4,480,862 | A | | 11/1984 | Fleming | |
| 4,587,997 | A | | 5/1986 | Brooks | |
| 5,271,446 | A | * | 12/1993 | Hwang | B60J 1/2033 160/120 |
| 5,680,893 | A | | 10/1997 | Neer | |
| 5,728,632 | A | | 3/1998 | Sugie | |
| 5,758,697 | A | | 6/1998 | Musha et al. | |
| 6,038,821 | A | | 3/2000 | Larson et al. | |
| 6,059,007 | A | | 5/2000 | Tomita | |
| 6,397,920 | B1 | | 6/2002 | Forin | |
| 6,408,922 | B2 | | 6/2002 | Desrochers | |
| 6,478,070 | B2 | | 11/2002 | Poppema | |
| 6,597,890 | B1 | | 7/2003 | Grubb et al. | |
| 6,629,555 | B2 | | 10/2003 | DeBlock et al. | |
| 6,763,855 | B2 | | 7/2004 | Rougvie | |
| 6,814,127 | B2 | | 11/2004 | Tagtow et al. | |
| 6,938,667 | B2 | | 9/2005 | Sugiyama et al. | |
| 7,007,735 | B1 | * | 3/2006 | Lake | E06B 9/52 160/374.1 |
| 7,210,513 | B2 | | 5/2007 | Goldenberg et al. | |
| 7,487,816 | B2 | | 2/2009 | Moriya et al. | |
| 7,661,226 | B2 | | 2/2010 | Kibbel et al. | |
| 8,011,413 | B2 | | 9/2011 | Poppema | |
| 8,683,771 | B2 | * | 4/2014 | Sawyers | E06B 9/52 29/525.08 |
| 9,624,722 | B2 | * | 4/2017 | Hummel | E06B 9/54 |
| 2001/0042346 | A1 | | 11/2001 | Brioschi | |
| 2002/0129554 | A1 | | 9/2002 | Van Leeuwen | |
| 2002/0153053 | A1 | | 10/2002 | Pintz et al. | |
| 2004/0033337 | A1 | | 2/2004 | Collins | |
| 2004/0154753 | A1 | | 8/2004 | Tagtow et al. | |
| 2007/0199667 | A1 | | 8/2007 | Jumbeck et al. | |
| 2008/0210385 | A1 | | 9/2008 | Sawyers et al. | |
| 2011/0315303 | A1 | | 12/2011 | Bird | |
| 2014/0262075 | A1 | | 9/2014 | Clarren et al. | |
| 2016/0265275 | A1 | * | 9/2016 | Rosell Rosell | A47K 3/38 |

* cited by examiner

RETRACTABLE FLEXIBLE-PANEL DOOR

CROSS-REFERENCE TO RELATED U.S. APPLICATION

This is a continuation of U.S. patent application Ser. No. 14/763,214, filed Jul. 24, 2015, which is the U.S. national phase of International Application No. PCT/US2014/019609, filed Feb. 28, 2014, which claims the benefit of, and priority to, U.S. Patent Application Ser. No. 61/770,567, filed Feb. 28, 2013, the disclosures of which are all expressly incorporated herein by reference.

FIELD OF THE INVENTION

The present invention relates generally to doors for residential and/or commercial building applications, and more specifically to retractable flexible-panel doors for such applications.

BACKGROUND

Conventional retractable, screen doors are generally mountable to existing door frames attached to buildings. Typically, such retractable screen doors include a main spring carried by a rotatable barrel mounted to one side of the door and attached to one side of the screen, and the opposite side of the screen is attached to a handle which includes part of a conventional latching mechanism. Another part of the latching mechanism is then attached to the opposite side of the door, and the handle can thereby be latched to the opposite side of the door with the screen extending across the doorway. When the latch is disengaged, the screen is retracted onto the rotatable barrel under the biasing force of the mainspring. Such retractable screen doors have been used extensively heretofore in both residential and commercial applications.

SUMMARY

The present invention may comprise one or more of the features recited in the attached claims, and/or one or more of the following features and combinations thereof. In a first aspect, a retractable, flexible-panel door mountable to a door frame attached to a building may comprise a first side rail mountable to one side of the door frame, a second side rail mountable to an opposite side of the door frame, a top rail mountable to and between the first and second side rails along a top of the door frame, a bottom rail mountable to and between the first and second side rails along a bottom of the door frame, a handle coupled to and between the top and bottom rails, a flexible panel extending between the handle and one of the first and second side rails, and at least one biasing member carried by at least one of the first side rail, the second side rail, the top rail and the bottom rail to apply a force to the handle to draw the handle toward the one of the first and second side rails. The top and bottom rails may each be expandable in length to accommodate mounting of the retractable, flexible panel door to door frames of different widths between the one side of the door frame and the opposite side of the door frame.

The retractable, flexible-panel door may further comprise a sill plate attachable to the bottom rail. The sill plate may comprise a center sill plate attachable to the bottom rail, a first sill extension slidably engageable with the center sill plate adjacent one side thereof and a second sill extension slidably engageable with the center sill plate adjacent an opposite side thereof. The first and second sill extensions may each be slidably positionable relative to the center sill plate to accommodate mounting of the retractable, flexible panel door to door frames of different widths.

Alternatively or additionally, the retractable, flexible-panel door may further comprise a first end cap affixed to one end of the first side rail, a second end cap affixed to an opposite end of the first side rail, a third end cap affixed to one end of the second side rail, and a fourth end cap affixed to an opposite end of the second side rail. The top rail may comprise an elongated top rail member slidably coupled to each of the first and third end caps in an axial direction such that a total axial length of a combination of the top rail member and the first and third end caps is variable between minimum and maximum lengths. The bottom rail may comprise an elongated bottom rail member slidably coupled to each of the second and fourth end caps in an axial direction such that a total axial length of a combination of the bottom rail member and the second and fourth end caps is variable between the minimum and maximum lengths. The first and third end caps may each define a channel therein extending along the axial direction, and one end of the top rail member may be received within and movable along the channel defined in the first end cap and an opposite end of the top rail member may be received within and movable along the channel defined in the third end cap. Alternatively or additionally, the second and fourth end caps may each define a channel therein extending along the axial direction, and one end of the bottom rail member may be received within and movable along the channel defined in the second end cap and an opposite end of the top rail member may be received within and movable along the channel defined in the fourth end cap.

In accordance with the first aspect, the at least one biasing member may comprise a single biasing member carried by one of the first and second side rails. Alternatively or additionally, the first side rail may include a first elongated housing having a first planar surface extending a length of the first elongated housing and a second planar surface adjacent to and normal to the first planar surface and extending the length of the first elongated housing. The first and second planar surfaces may be configured to engage two corresponding normal surfaces of one side of the door frame, and the first elongated housing may be mountable to the one side of the door frame along one of the first and second planar surfaces. The second side rail may include a second elongated housing having a first planar surface extending a length of the second elongated housing and a second planar surface adjacent to and normal to the first planar surface and extending the length of the second elongated housing. The first and second planar surfaces may be configured to engage two corresponding normal surfaces of an opposite side of the door frame, and the second elongated housing may be mountable to the opposite side of the door frame along one of the first and second planar surfaces.

In a second aspect, a retractable, flexible-panel door mountable to a door frame attached to a building may comprise a first rail mountable to either side of the door frame, a second rail mountable to either side of the door frame, a third rail mountable to and between the first and second side rails along a top or bottom of the door frame, a fourth rail mountable to and between the first and second side rails along the top or bottom of the door frame, a handle configured to be coupled to and between the third and fourth rails, a flexible panel extending between the handle and one of the first and second side rails, and at least one biasing member carried by at least one of the first side rail, the second side rail, the top rail and the bottom rail to apply a force to the handle to draw the handle toward the one of the first and second side rails.

The third and fourth rails may each be expandable in length to accommodate mounting of the retractable, flexible panel door to door frames of different widths between the one side of the door frame and the opposite side of the door frame.

Alternatively or additionally, the retractable, flexible-panel door may further comprise a sill plate attachable to either of the third and fourth rails. The sill plate may comprise a center sill plate attachable to the either of the third and fourth rails, a first sill extension slidably engageable with the center sill plate adjacent one side thereof, and a second sill extension slidably engageable with the center sill plate adjacent an opposite side thereof. The first and second sill extensions may each be slidably positionable relative to the center sill plate to accommodate mounting of the retractable, flexible panel door to door frames of different widths.

In accordance with the second aspect, the handle may comprise an elongated door guide coupled to and between the third and fourth rails, and a door handle mounted to the elongated door guide. The door handle may have a latching member that is movable axially along the elongated door guide, and the latching member may include at least one biasing member that biases the latching member to an equilibrium position relative to the elongated door guide from positions on either side of the equilibrium position. The retractable, flexible-panel door may further comprise a latch hook mounted to one of the first and second rails, the latch hook including a hook member extending therefrom, and the latching member may include a latch plate defining a latch plate opening. The latching member may be positioned relative to the latch hook to capture the hook member within the latch plate opening when the latching member is in the equilibrium position.

In accordance with the second aspect, the flexible panel may comprise a mesh panel having a first weave density with an area of the mesh panel extending along at least one of a top of the flexible panel and a bottom of the flexible panel having a second weave density greater than the first weave density.

In a third aspect, a retractable, flexible-panel door mountable to a door frame attached to a building may comprise a first side rail mountable to one side of the door frame, a second side rail mountable to an opposite side of the door frame, a top rail mountable to and between the first and second side rails along a top of the door frame, a bottom rail mountable to and between the first and second side rails along a bottom of the door frame, a handle coupled to and between the top and bottom rails, at least one biasing member carried by at least one of the first side rail, the second side rail, the top rail and the bottom rail to apply a force to the handle to draw the handle toward the one of the first and second side rails, and a flexible panel extending between the handle and one of the first and second side rails. The flexible panel may comprise a mesh panel having a first weave density with at least one area of the mesh panel having a second weave density greater than the first weave density to visually distinguish the at least one area from the mesh panel having the first weave density.

The top and bottom rails may each be expandable in length to accommodate mounting of the retractable, flexible panel door to door frames of different widths between the one side of the door frame and the opposite side of the door frame. The retractable, flexible-panel door may further comprise a sill plate attachable to the bottom rail. The sill plate may comprise a center sill plate attachable to the bottom rail, a first sill extension slidably engageable with the center sill plate adjacent one side thereof and a second sill extension slidably engageable with the center sill plate adjacent an opposite side thereof. The first and second sill extensions may each be slidably positionable relative to the center sill plate to accommodate mounting of the retractable, flexible panel door to door frames of different widths.

In accordance with the third aspect, the mesh panel may define a horizontal centerline, and the at least one area of the mesh panel having a second weave density may include a first area of the mesh panel having the second weave density and positioned a distance from the centerline in one direction and a second area of the mesh panel having the second weave density positioned the distance from the centerline in an opposite direction from the one direction.

In accordance with the third aspect, the mesh panel may include another area, extending along at least one of a top of the flexible panel and a bottom of the flexible panel, having the second weave density.

DESCRIPTION OF THE ILLUSTRATIVE EMBODIMENTS

For the purposes of promoting an understanding of the principles of the invention, reference will now be made to a number of illustrative embodiments shown in the attached drawings and specific language will be used to describe the same.

Figure 1:
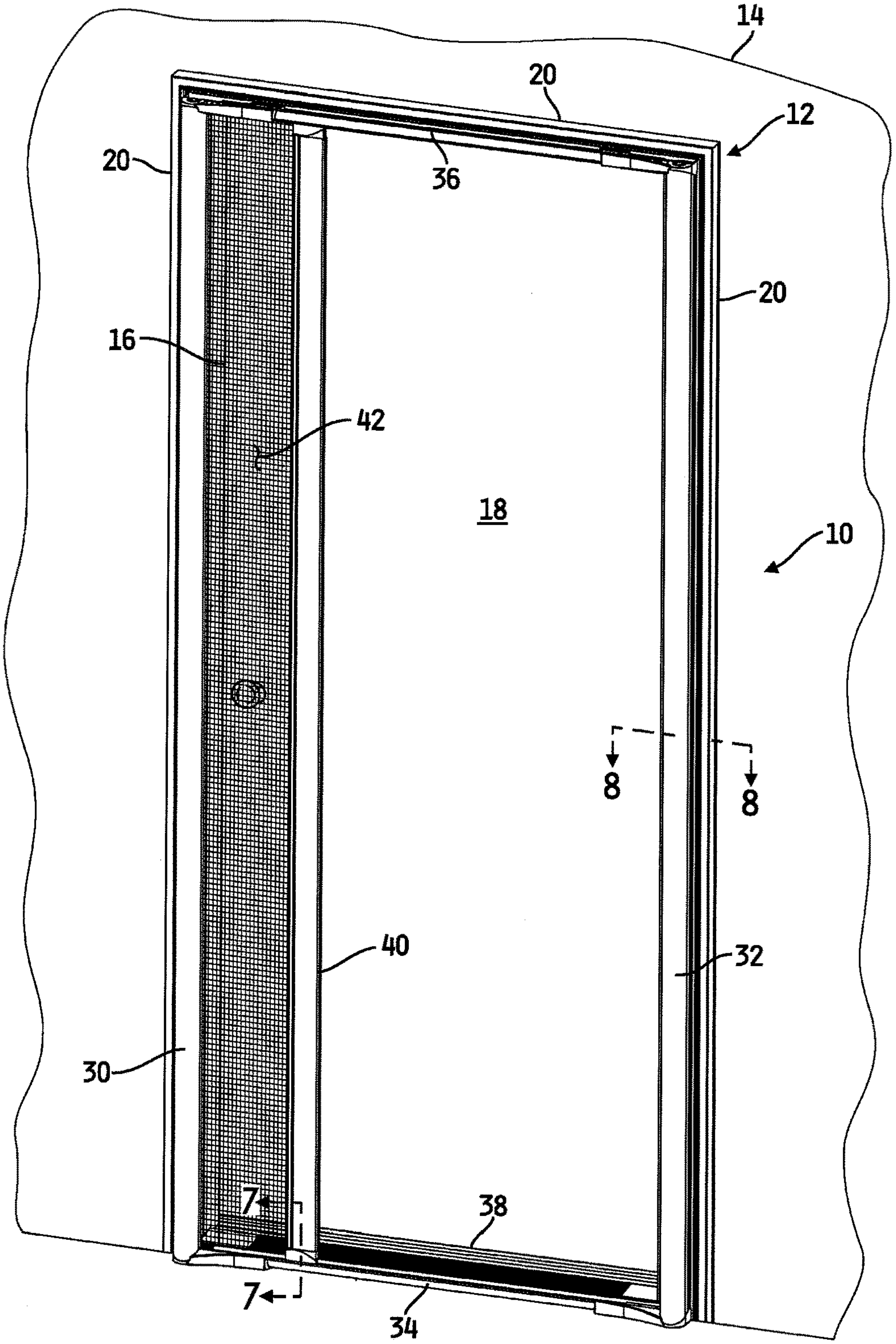
FIG. 1 is a perspective view of an embodiment of a retractable flexible-panel door mounted in a conventional doorway.

Referring to FIG. 1, an embodiment of a retractable flexible-panel door 10 is shown mounted to and within a conventional doorway 12 of a building 14. In one embodiment, the retractable flexible-panel door 10 illustratively includes one or more biasing members acting on each side of a handle 40 of the door 10 to allow the combination of the handle and the flexible panel to be movable between open and closed positions while balancing forces applied by the biasing members to the handle 40. As a result, the handle 40 is generally movable without binding between the two opposing sides of the door 10, i.e., between open and closed positions of the handle and flexible panel, and will typically remain stationary at any position to which it is moved between the two opposing sides. This latter feature obviates the need for a latch assembly on the handle 40 and one side of the door 10, although some embodiments of the door 10 may illustratively include a conventional latch assembly if desired. In some embodiments, the two or more biasing members may be constant-force biasing members acting on each side of handle 40, although in alternate embodiments the two or more biasing members may be non-linear biasing members, i.e., biasing members which apply a biasing force that is non-linear over the range of movement of the handle 40. In other embodiments, the retractable flexible-panel door 10 includes one or more constant-force biasing members acting only on one side of a handle of the door 10 in order to maintain constant force applied by the one or more such biasing members on the handle 40 along the entire length of travel of the handle 40 between the two sides of the door 10. In any case, the top rail, bottom rail and sill plate of the door 10 in some embodiments are illustratively adjustable in length to accommodate installation in doorways of differing width. In some embodiments, each opposing vertical side of the retractable flexible-panel door 10 defines one or more flanges which facilitate mounting of the door 10 in an existing doorway. Such flanges, alone or in combination with the adjustable-length top and bottom rails, further facilitate mounting of the door 10 to and within doorways that are not true. In some embodiments, the sill plate is illustratively pivotable about a longitudinal axis defined along a length of the bottom rail to accommodate installation in doorways that include existing sill plates of differing height and/or that do not include an existing sill plate. The door 10 may include any one or combination of the foregoing features.

The building 14 to which the retractable flexible-panel door 10 is mounted may illustratively be a residential or commercial building, and the doorway 12 is likewise illustratively conventional. For example, the doorway 12 includes a conventional door frame 16 mounted to an appropriately sized opening in the building 14, a conventional door 18 pivotably connected, e.g., by one or more hinges, to the door frame 16 and a conventional brick molding 20 attached to a front portion of the door frame 16 and to the building 14 at least partially about the door frame 16, e.g., extending about the two opposing sides and the top of the door frame 16. Alternatively, the doorway 12 may have a double-width door mounted therein, e.g., a conventional sliding door, French door, or the like, in which a vertical junction separates one section from the other, and in such embodiments the retractable flexible-panel door may be mounted between one side of the double-width door and the vertical junction.

In the illustrated embodiment, the retractable flexible-panel door 10 includes a pair of opposing side rails 30, 32, a bottom rail 34 extending between and operatively connected to bottom ends of each side rail 30, 32 and a top rail 36 extending between and operatively connected to top ends of each side rail 30, 32. An adjustable sill plate 38 is operatively connected to the bottom rail 34 along an inner side thereof, and is adjustable both in length and in incline relative to the bottom rail 34 as will be described in greater detail below. One end of an elongated door handle 40 is slidably received within the bottom rail 34, and an opposite end of the door handle 40 is slidably received within the top rail 36 such that the handle 40 is movable between the two side rails 30, 32.

At least a portion of one side of a flexible panel 42 is attached to one side of the handle 40, and at least a portion of an opposite side of the flexible panel 42 is attached to a rotatable barrel carried by one of the side rails 30, 32. The flexible panel 42 is paid out from, i.e., is drawn away from, the barrel as the handle 40 is moved away from the barrel toward the opposite side rail and, as will be described in greater detail below, the barrel carried by the side rail 30, 32 is biased such that the flexible panel 42 wraps around the barrel as the handle 40 moves toward the side rail 30, 32 carrying the barrel. In the embodiment illustrated in FIG. 1, the flexible panel 42 extends between the left-most side rail 30 and the handle 40, although in other embodiments the flexible panel 42 may alternatively extend between the handle 40 and the opposite side rail 32. In still other embodiments, the top and bottom rails 34, 36 are configured identically so that the sill plate 38 can be mounted to either, and in such embodiments the door 10 may be oriented relative to the doorway 12 such that the flexible panel 42 extends between the handle 40 and either of the right or left sides. In still further embodiments, the top and bottom rails 30, 32 are detachably mountable to the top and bottom rails 34, 36 such that the side rails 30, 32 are interchangeable and may be mounted to either side of the doorway 12. The door 10 may include any one or combination of these features.

In the illustrated embodiment, one side of the flexible panel 42 is attached along its entire length to one side of the handle 40, and the opposite side of the flexible panel 42 is attached along its entire length to a rotatable barrel carried by the side rail 30, although it will be understood that either or both sides of the flexible panel 42 may alternatively be attached to its corresponding structure only partially along its length. In any case, the flexible panel 42 may be partially or completely porous, partially porous or non-porous, and one or more portions, or all, of the flexible panel 42 may be transparent, translucent or completely opaque. The flexible panel 42 may be provided in the form of any flexible material, or combination of flexible materials, capable of being wound around, and paid out from, a rotatable barrel carried by one of the side rails 30, 32. Examples of such one or more flexible materials include, but should not be limited to, metal, metal composite, fabric, synthetic or semi-synthetic moldable, i.e., plastic, material, or the like, and one or more coatings, e.g., waterproof or otherwise, may be applied to any such material(s) making up the flexible panel 42. In one example embodiment, which should not be considered to be limiting in any way, the flexible panel 42 is provided in the form of a conventional metal or composite metal screen mesh.

Figure 2:
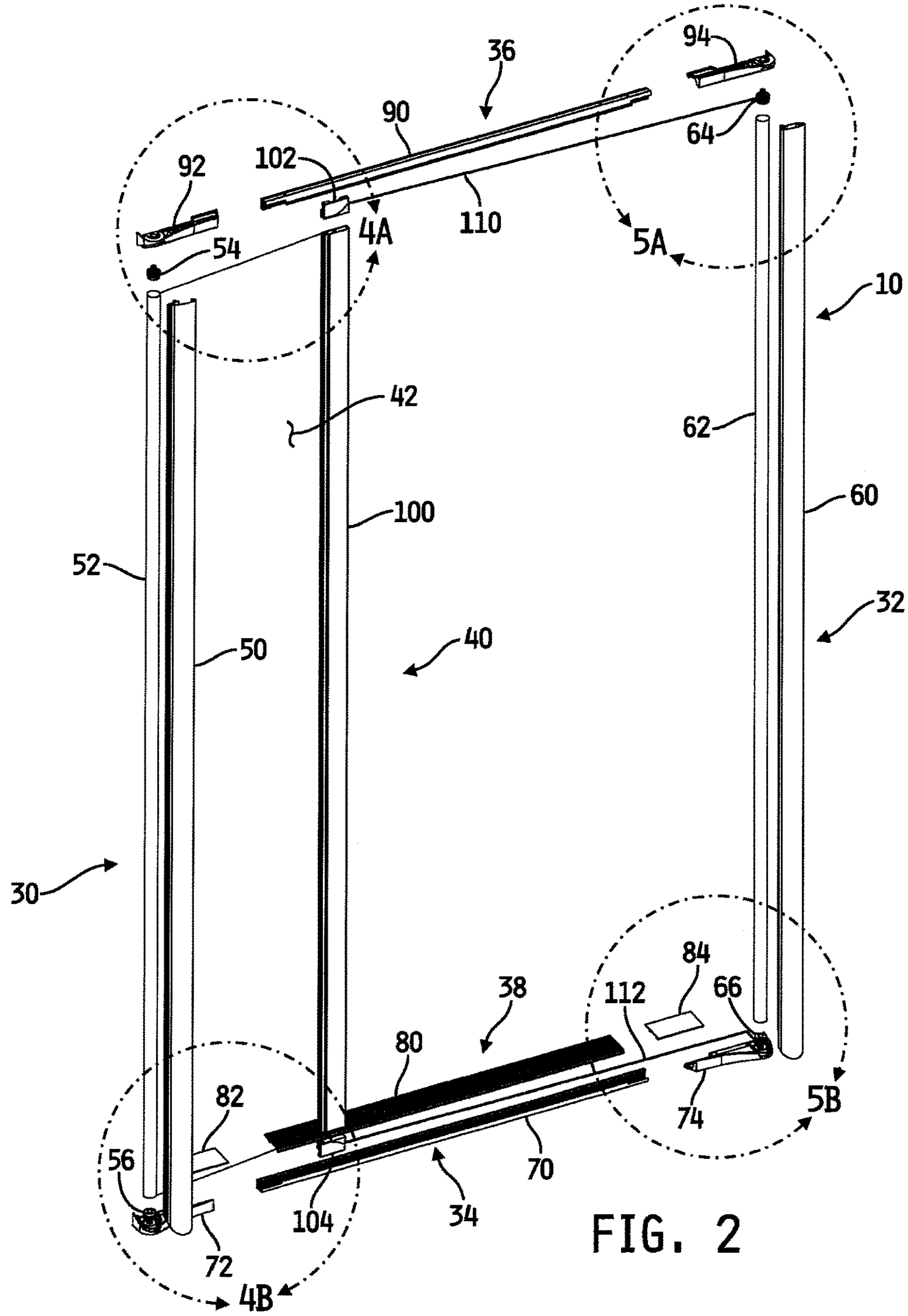
FIG. 2 is an exploded perspective view of the retractable flexible-panel door of FIG. 1.

Referring now to FIG. 2, an exploded view of the retractable flexible-panel door 10 is shown in which the flexible panel 42 is illustrated as a transparent panel only for the purpose of providing an unobstructed view of various components of the door 10, and this illustration of the flexible panel 42 therefore should not be considered to be limiting in any way. In the illustrated embodiment, the side rail 30 includes an elongated barrel housing 50 and an elongated, rotatable barrel 52, and the side rail 32 likewise includes an elongated barrel housing 60 and an elongated, rotatable barrel 62. The bottom rail 34 includes a center rail member 70 and two opposing end portions 72, 74, and the top rail 36 likewise includes a center rail member 90 and two opposing end portions 92, 94. In the illustrated embodiment, the center rail member 70 and two corresponding end portions 72, 74 of the bottom rail 34, and the center rail member 90 and two corresponding end portions 92, 94 of the top rail 36, are movable relative to each other such that the lengths of the bottom and top rails 34, 36 are adjustable to accommodate different width doorways 12. In one embodiment, these components are illustratively designed to allow the lengths of the bottom and top rails 34, 36 to be adjustable to accommodate doorways 12 having doors 18 of between approximately 32-36 inches, although the foregoing components may alternatively be designed to allow for adjustment between other lengths and/or ranges of lengths.

In the embodiment illustrated in FIG. 2, the sill plate 38 includes a center sill plate 80 pivotably mounted to the center rail member 70 of the bottom rail 34, and a pair of sill extensions 82 and 84 slidably mountable to opposite ends respectively of the sill plate 80. These components, like the components making up the top and bottom rails 34, 36, are illustratively designed to allow the length of the sill plate 38 to be adjustable to accommodate different width doorways 12. In the embodiment illustrated above by example, the sill plate 80 and the sill extensions 82, 84 are illustratively designed to allow the lengths of the sill plate 38 to be adjustable to accommodate doorways 12 having doors 18 of between approximately 32-36 inches, although the foregoing components may alternatively be designed to allow for adjustment between other lengths and/or ranges of lengths.

In the embodiment illustrated in FIG. 2, the door 10 further includes a biasing member 54 coupled between the top end of the barrel 52 and the end portion or end cap 92 of the top rail 36, and a bearing 56 coupled between the bottom end of the barrel 52 and the end portion or end cap 72 of the bottom rail 34. The biasing member 54 is illustratively affixed to the barrel 52, and operates to bias the barrel 52 for rotation, relative to the end cap 92 of the top rail 36, about a longitudinal axis defined through the barrel 52. The bearing 56 is also illustratively affixed to the barrel 52, and operates to allow free rotation of the barrel 52, about its longitudinal axis, relative to the end cap 72 of the bottom rail 34, e.g., under the rotational force of the biasing member 54 and/or in response to movement of the door 40. The door 10 further includes another biasing member 64 coupled between the top end of the barrel 62 and the end portion or end cap 94 of the top rail 36, and another bearing 66 coupled between the bottom end of the barrel 62 and the end portion or end cap 74 of the bottom rail 34. The biasing member 64 is illustratively affixed to the barrel 62, and is identical in structure and operation to the biasing member 54 in that it operates to bias the barrel 62 for rotation, relative to the end cap 94 of the top rail 36, about a longitudinal axis defined through the barrel 62. The bearing 66 is also illustratively affixed to the barrel 52, and is identical in structure and operation to the bearing 56 in that it operates to allow free rotation of the barrel 62, about its longitudinal axis, relative to the end cap 74 of the bottom rail 34.

In the embodiment illustrated in FIG. 2, the handle 40 of the door 10 includes a center handle member 100 attachable at its top end to a top handle member 102, and attachable at its bottom end to a bottom handle member 104. The top handle member 102 is configured, as will be described in detail below, to slidably engage the center rail member 90 of the top rail 36 such that the handle 40 is coupled to, i.e., engaged with, and is movable along the length of, the center rail member 90. The bottom handle member 104 is likewise configured to slidably engage the center rail member 70 of the bottom rail 34 such that the handle 40 is coupled to, i.e., engaged with, and is movable along the length of, the center rail member 70.

Figure 3:
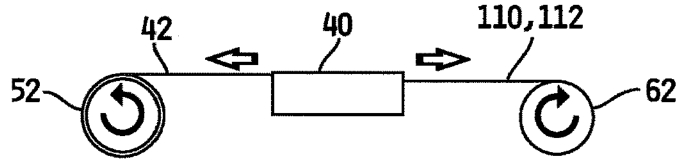
FIG. 3 is a schematic diagram illustrating operation of the retractable flexible-panel door of FIGS. 1 and 2.

The door 10 further includes a cord 110 extending between, and affixed to, the biasing member 64 and a top portion of the handle 40, and a cord 112 extending between, and affixed to, the bearing 66 and a bottom portion of the handle 40. The biasing member 64, through the cord 110, acts to balance the force applied to the handle 40 by the biasing member 54 through the upper portion of the flexible panel 42, and the bearing 66, through the cord 112, acts to balance the force applied to the handle 40 by the combination of the biasing member 54 and the bearing 56 through the lower portion of the flexible panel 42. Referring to the schematic diagram illustrated in FIG. 3, for example, the biasing force of the biasing member 54 causes the barrel 52 to rotate counterclockwise relative to the bottom and top rails 34, 36 such that the combination of the handle 40 and the flexible panel 42 is forced by the biasing member 54 in a direction toward the barrel 52, and the biasing force of the biasing member 64 causes the barrel 62 to rotate clockwise relative to the bottom and top rails 34, 36 such that the combination of the handle 40 and the cords 110, 112 is forced by the biasing member 64 in a direction toward the barrel 62.

The biasing forces acting on the handle 40 through the flexible panel 42 and the cords 110, 112 are thus theoretically equal and opposite, and the handle 40 should therefore remain substantially stationary in any position to which it is manually moved, and subsequently released, between the two side rails 30, 32. However, due to mismatches in the biasing forces of physically realizable biasing members, e.g., as a result of material and/or manufacturing differences, biasing forces applied to one side of the handle 40 may not match that applied to the opposite side of the handle 40, and any such mismatch may be amplified if the biasing forces applied by the biasing members 54, 64 are non-linear. Accordingly, in order to minimize, or at least reduce the effect of any such mismatches, the biasing members 54, 64 are illustratively provided in the form of constant-force biasing members. In one embodiment, for example, such biasing members 54, 64 are conventional constant-force springs each configured to apply a constant rotational force to a corresponding barrel 52, 62. In any case, the biasing members 54, 64 may, in some alternative embodiments, be positioned between the bottom ends of the barrels 52, 62 and the end caps 72, 74 of the bottom rail 34, and the bearing members 56, 66 may be positioned between the top ends of the barrels 52, 62 and the end caps 92, 94 of the top rail 36. In other alternative embodiments, the bearing members 56, 66 may be replaced by corresponding biasing members 54, 64 such that the interfaces between each end of each barrel 52, 62 and the bottom and top rails 34, 36 each include a biasing member. In any such embodiments, the biasing members 54, 64 may be conventional constant-force springs or may alternatively be non-linear springs, i.e., biasing members which apply a biasing force that is non-linear over the range of movement of the handle 40 between the side rails 30, 32.

In one embodiment, the barrel housings 50, 60, the center rail member 70, the bottom rail end caps 72, 74, the center rail member 90, the top rail end caps 92, 94, the sill extensions 82, 84, the center handle portion 100, the top handle member 102, the bottom handle member 104, the bearing members 56, 66 and some portions of the biasing members 54, 64 are all formed of, or include, one or more moldable, e.g., plastic, materials such as one or more organic polymers, examples of which include, but should not be limited to, one or more thermoplastics, such as polyethylene, polypropylene, polystyrene, polyvinyl chloride (PVC) and polytetrafluoroethylene (PTFE), one or more thermosetting plastics, or the like. Alternatively, one or more of the foregoing components may be formed of, or include, other materials, examples of which include, but should not be limited to, wood, metal, metal composite, or the like. The barrels 52, 62, some portions of the biasing members 54, 64, e.g., at least the biasing portions, and the center sill plate 80 are each illustratively formed of one or more suitable metals or metal composites. Alternatively, one or more of these components may be formed of, or include, one or more other materials, examples of which include, but should not be limited to, wood, one or more moldable, e.g., plastic, materials, or the like.

Figure 4A:
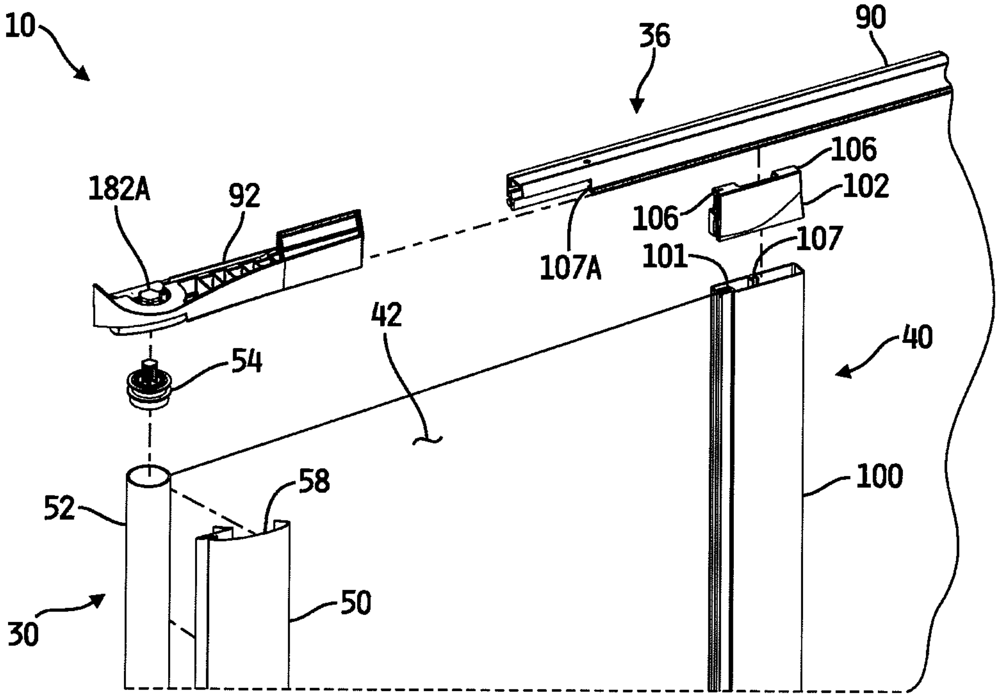
FIG. 4A is a magnified view of the portion of the retractable flexible-panel door of FIG. 2 contained within the dashed-line region 4A.
Figure 4B:
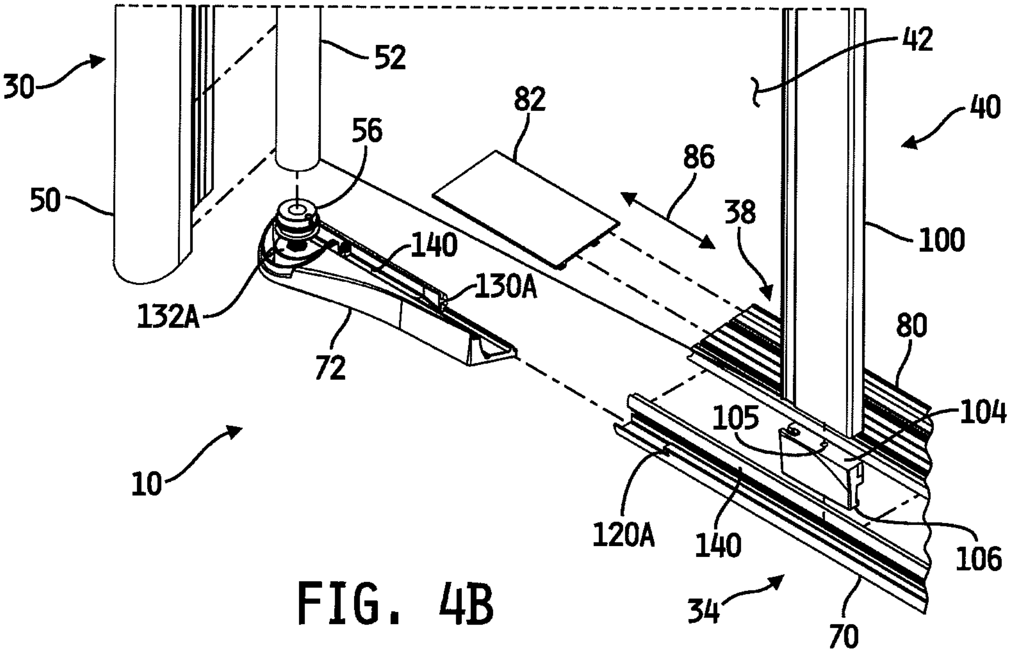
FIG. 4B is a magnified view of the portion of the retractable flexible-panel door of FIG. 2 contained within the dashed-line region 4B.

Referring now to FIGS. 4A and 4B, magnified views are shown of the portions of the retractable flexible-panel door 10 of FIG. 2 contained within the dashed-line regions 4A and 4B respectively. In the illustrated embodiment, one end of the center rail member 70 of the bottom rail 34 defines a notched portion 120A leading to a channel 140 that is sized and configured to receive into engagement the bottom handle member 104 of the handle 40 such that the bottom handle member 104, and thus the handle 40, is movable along the channel 140 between the side rails 30, 32. In the illustrated embodiment, for example, the bottom handle member 104 defines a number of L-shaped protrusions 106 extending from a bottom surface thereof, and the channel 140 is shaped to receive into engagement the protrusions 106 as is shown and will be described in greater detail below with respect to FIGS. 7A and 7B. In any case, the bottom handle member 104 is further configured to be attached to the bottom of the center handle portion 100 of the handle, and in the embodiment illustrated in FIG. 4B the top surface of the bottom handle member 104 defines a bore 105 therein that is sized to receive a fixation element, e.g., a screw, to secure the bottom handle member 104 to the center handle member 100.

The end of the end cap 72 facing the center rail member 70 also defines a notched portion 130A leading to a channel 140, and the end cap 72 is configured to slidingly engage the center rail member 70 such that the channels 140 align. The end cap 72 is movable relative to the center rail member 70 along the longitudinal axis defined by the channel 140 such that the position of the end cap 72 relative to the center rail member 70 is adjustable to accommodate doorways 12 of different width as described above. For example, the end cap 72 is movable relative to the center rail member 70 between a minimum-width position in which the notched portion 130A abuts the free end of the center rail member 70 and the notched portion 120A of the center rail portion abuts the free end of the end cap 72, and a maximum width position in which the notched portion 130A is spaced apart from the free end of the center rail member 70 and the notched portion 120A of the center rail portion is spaced apart from the free end of the end cap 72, with the end cap 72 still engaged with the center rail member 70 such that in these positions and with the end cap 72 and the center rail member 70 in positions between these two extremes, the channels 140 defined by the two components form a continuous channel.

The opposite end of the end cap 72 carries a bearing interface 132A defining recess sized and configured to receive a post extending from the bearing member 56 such that the bearing member 56 is rotatable relative to the interface 132A. In the illustrated embodiment, the bearing member 56 is partially received within and affixed to the bottom end of the barrel 52, and the combination of the barrel 52 and the bearing 56 is rotatable about the longitudinal axis of the barrel 52 relative to the interface 132A.

The sill extension 82 and the sill plate 80 illustrated in FIG. 4B are each configured to allow the sill extension 82 to be received in sliding engagement by the sill plate 80 such that the sill extension 82 is movable relative to the sill plate 80 along a longitudinal axis defined by the sill plate 80, e.g., such that the sill extension 82 may be advanced onto and extended from the sill plate 80 in directions indicated by the directional arrow 86. Details relating to the structural engagement of the sill extension 82 with the sill plate 80 are shown and will be described in greater detail below with respect to FIG. 6.

As shown in FIG. 4A, one end of the center rail member 90 of the top rail 36 defines a notched portion 170A leading to a channel that is sized and configured to receive into engagement the top handle member 102 of the handle 40 such that the top handle member 102, and thus the handle 40, is movable along this channel between the side rails 30, 32. As with the bottom handle member 104, the top handle member 102 defines a number of L-shaped protrusions 106 extending from a top surface thereof, and the channel defined by the center rail member 90 is shaped to receive into engagement the protrusions 106 as is shown and will be described in greater detail below with respect to FIGS. 7A and 7B. The top handle member 102 is further configured to be attached to the top of the center handle portion 100 of the handle, and in the embodiment illustrated in FIG. 4A the top surface of the center handle member 100 defines a bore 107 therein that aligns with a bore 105 defined in the top handle member 100, e.g., see FIG. 4B, and together the bore 105 and the bore 107 are sized to receive a fixation element, e.g., a screw, to secure the top handle member 102 to the center handle member 100. The bottom surface of the center handle member 100 defines a similar bore 107 therein that aligns with the bore 105 in the bottom handle member 104, and a fixation element likewise engages both such bores 105, 107 to affix the bottom handle member 104 to the bottom of the center handle member 100.

The end of the end cap 92 facing the center rail member 90 also defines a notched portion leading to a channel, and the end cap 92 is configured to slidingly engage the top center rail member 90 such that these channels align as described with respect to the bottom center rail member 70 and end cap 72. The end cap 92 is movable relative to the center rail member 90 along the longitudinal axis defined by this channel such that the position of the end cap 92 relative to the center rail member 90 is adjustable to accommodate doorways 12 of different width as described above with respect to FIG. 4B. The opposite end of the end cap 92 carries a bearing interface 182A defining recess sized and configured to receive a post extending from the biasing member 54 such that the biasing member 54 is rotatable relative to the interface 182A. In the illustrated embodiment, the biasing member 54 is partially received within and affixed to the top end of the barrel 52, and the combination of the barrel 52 and the biasing member 54 is rotatable about the longitudinal axis of the barrel 52 relative to the interface 182A. As also shown in FIG. 4A, one side of the center handle member 100 includes a channel 101 that is sized and configured to receive into engagement one side or edge of the flexible panel 42 such that the flexible panel 42 is secured to the channel 101 of the center handle member 100.

Figure 5A:
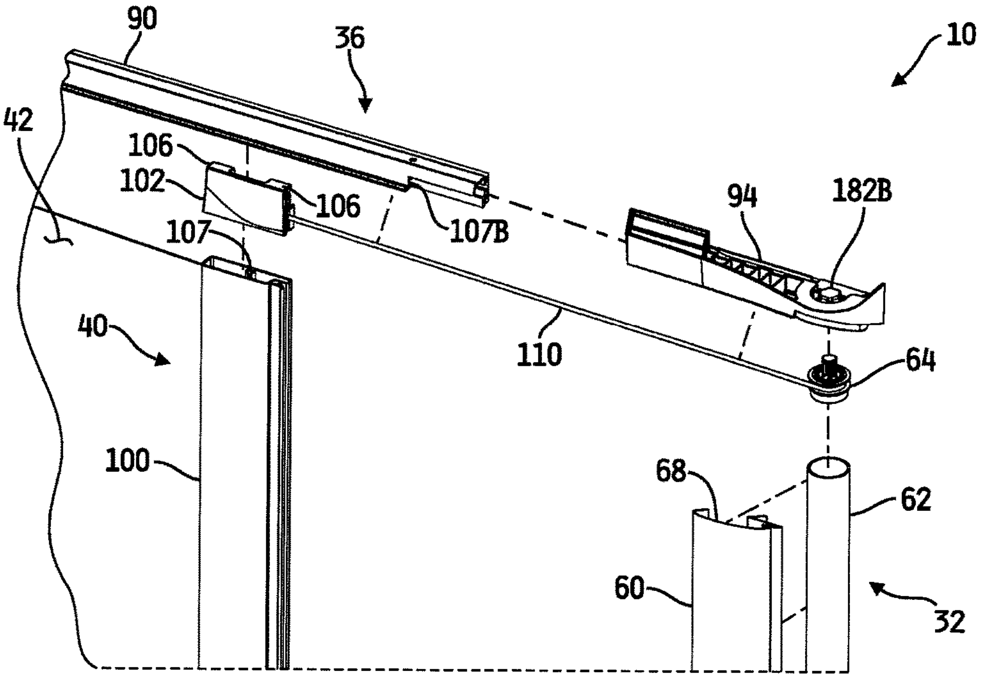
FIG. 5A is a magnified view of the portion of the retractable flexible-panel door of FIG. 2 contained within the dashed-line region 5A.
Figure 5B:
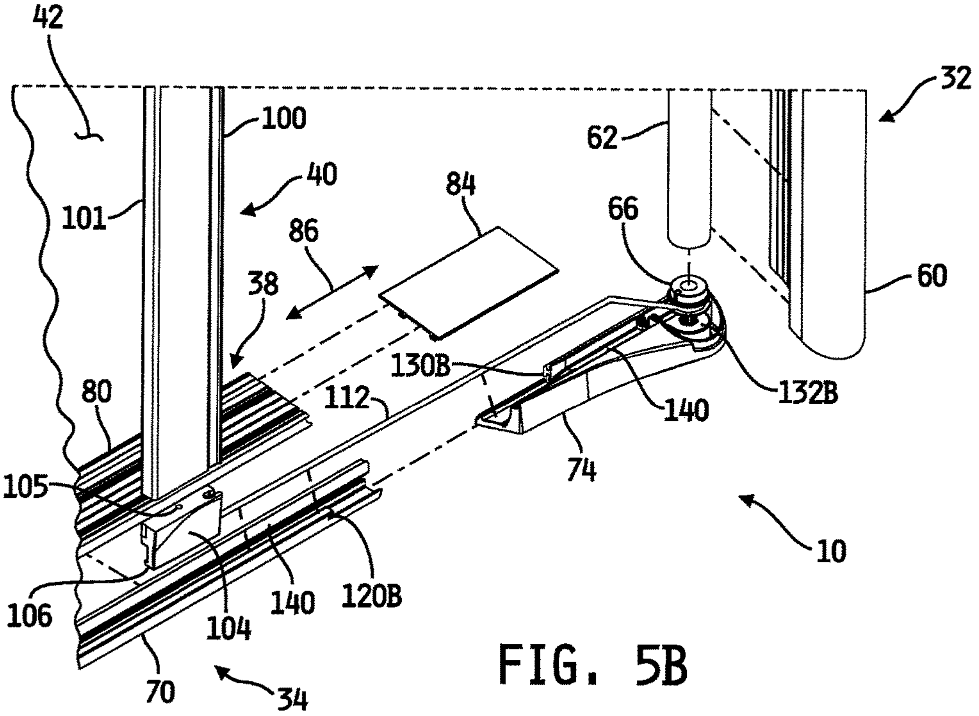
FIG. 5B is a magnified view of the portion of the retractable flexible-panel door of FIG. 2 contained within the dashed-line region 5B.

Referring now to FIGS. 5A and 5B, magnified views are shown of the portions of the retractable flexible-panel door 10 of FIG. 2 contained within the dashed-line regions 5A and 5B respectively. In the illustrated embodiment, the opposite end of the center rail member 70 of the bottom rail 34 defines a notched portion 120B leading to the channel 140 that is sized and configured to receive into engagement the bottom handle member 104 of the handle 40. The end of the end cap 72 facing the center rail member 70 also defines a notched portion 130B leading to a channel 140, and the end cap 74 is configured to slidingly engage the center rail member 70 such that the channels 140 align. The end cap 74 is movable relative to the center rail member 70 along the longitudinal axis defined by the channel 140 such that the position of the end cap 74 relative to the center rail member 70 is adjustable to accommodate doorways 12 of different width as described above with respect to FIG. 4B. The opposite end of the end cap 74 carries a bearing interface 132B defining recess sized and configured to receive a post extending from the bearing member 66 such that the bearing member 66 is rotatable relative to the interface 132B. In the illustrated embodiment, the bearing member 66 is partially received within and affixed to the bottom end of the barrel 62, and the combination of the barrel 62 and the bearing 66 is rotatable about the longitudinal axis of the barrel 62 relative to the interface 132B.

The sill extension 84 and the sill plate 80 illustrated in FIG. 5B are each configured to allow the sill extension 84 to be received in sliding engagement by the sill plate 80 as described above with respect to FIG. 4B such that the sill extension 84 is movable relative to the sill plate 80 along a longitudinal axis defined by the sill plate 80, e.g., such that the sill extension 84 may be advanced onto and extended from the sill plate 80 in directions indicated by the directional arrow 86.

As shown in FIG. 5A, one end of the center rail member 90 of the top rail 36 defines a notched portion 170B leading to a channel that is sized and configured to receive into engagement the top handle member 102 of the handle 40 such that the top handle member 102, and thus the handle 40, is movable along this channel between the side rails 30, 32 as described above.

The end of the end cap 94 facing the center rail member 90 also defines a notched portion leading to a channel, and the end cap 94 is configured to slidingly engage the top center rail member 90 such that these channels align as described with respect to the bottom center rail member 70 and end cap 72. The end cap 94 is movable relative to the center rail member 90 along the longitudinal axis defined by this channel such that the position of the end cap 94 relative to the center rail member 90 is adjustable to accommodate doorways 12 of different width as described above with respect to FIG. 4B. The opposite end of the end cap 94 carries a bearing interface 182B defining recess sized and configured to receive a post extending from the biasing member 64 such that the biasing member 64 is rotatable relative to the interface 182B. In the illustrated embodiment, the biasing member 64 is partially received within and affixed to the top end of the barrel 62, and the combination of the barrel 62 and the biasing member 64 is rotatable about the longitudinal axis of the barrel 62 relative to the interface 182B.

The cord 110 extends between the biasing member 64 and the top handle member 102 and one end of the cord 110 is affixed to the top handle member 102 and an opposite end is affixed to the biasing member 64. Alternatively, the cord 110 may be affixed between the center handle member 100 and the biasing member 64, between the barrel 62 and the top handle member 102 or between the barrel 62 and the center handle member 100. The cord 112 likewise extends between the bearing member 66 and the bottom handle member 104 and one end of the cord 112 is affixed to the bottom handle member 104 and an opposite end is affixed to the bearing member 66. Alternatively, the cord 112 may be affixed between the center handle member 100 and the bearing member 66, between the barrel 62 and the bottom handle member 104 or between the barrel 62 and the center handle member 100. In any case, in operation the cord 112 travels along the channel 140 defined by the bottom center rail member 70 and the end cap 74, and the cord 110 likewise travels along the channel defined by the top center rail member 90 and the end cap 94.

Figure 6:
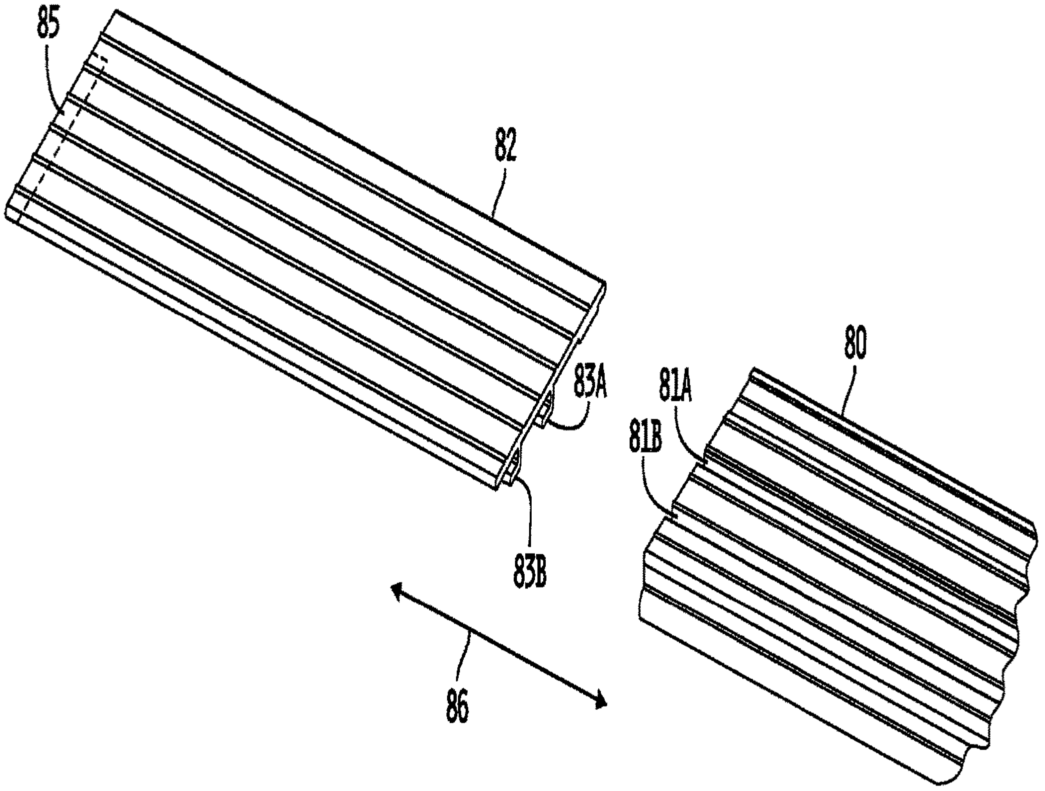
FIG. 6 is a perspective view of the door sill of the retractable flexible-panel door of FIGS. 1-5B illustrating engagement of one of the adjustably positionable sill ends relative to the middle sill.

Referring now to FIG. 6, a magnified view is shown of one end of the sill plate 80 and the sill extension 82. The opposite end of the sill plate 80 and the sill extension 84 are configured in like manner. In the illustrated embodiment, the sill plate 80 defines channels or grooves 81A and 81B which are sized and configured to receive in sliding engagement a corresponding pair of ribs 83A and 83B extending from a bottom surface of the sill extension 82. The ribs 83A and 83B are illustratively L-shaped in cross section, and the channels or grooves 81A and 81B are complementarily configured such that the ribs 83A and 83B engage and are slidingly movable along the channels or grooves 81A and 81B so that the sill extension 82 is movable relative to the sill plate 80 in the directions indicated by the directional arrow 86. The sill extension 82 is illustratively flexible and may be trimmed, e.g., with conventional scissors, to selectively remove one or more portions, e.g., portion 85 illustrated by dashed-line representation, to conform to the door frame 16 and/or trim molding at the base of the doorway 12.

Figure 7A:
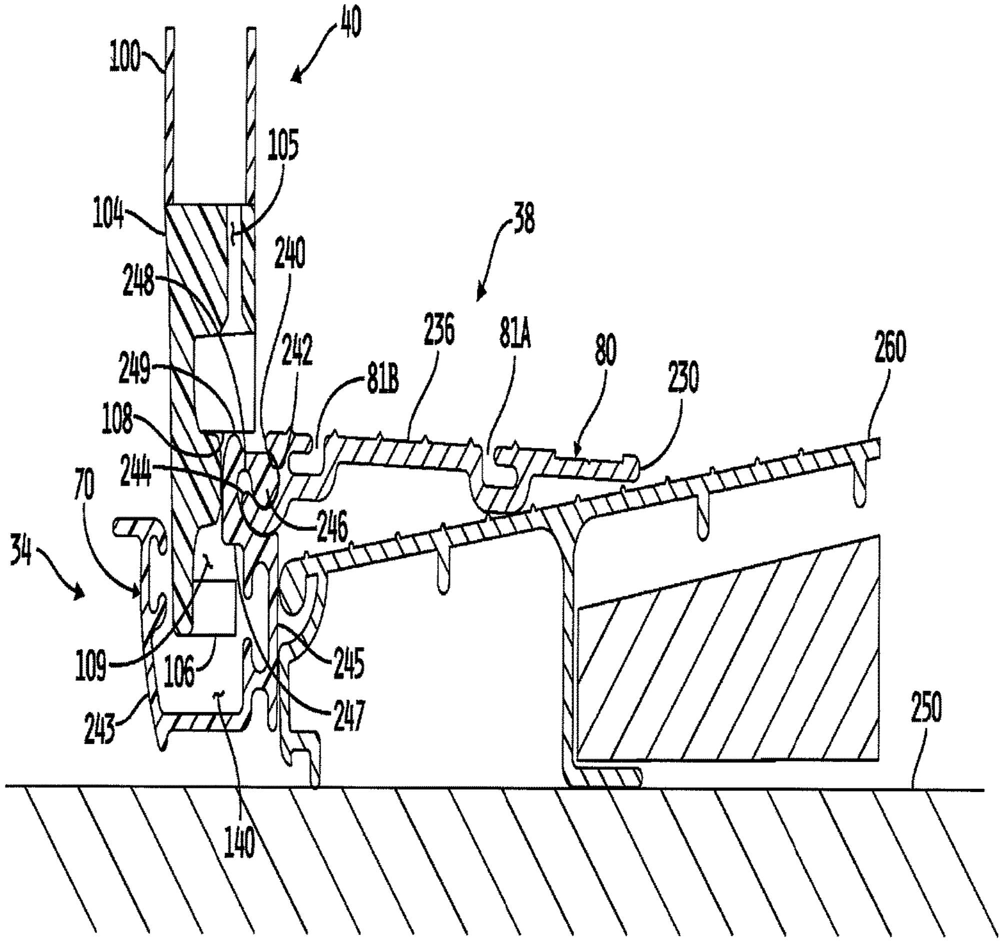
FIG. 7A is a cross-sectional view, along section lines 7-7 of FIG. 1, illustrating the free end of the pivotable sill of the retractable flexible-panel door of FIGS. 1-6 in contact with a sill plate of a doorway to which the retractable flexible-panel door is mounted.

Referring now to FIG. 7A, a cross-sectional view, along section lines 7-7 of FIG. 1, is shown illustrating the sill plate 38 of the door 10 of FIGS. 1-6 in contact with an existing sill plate 260 mounted to a floor 250 below the doorway 12. In the illustrated embodiment, one end 240 of the center sill plate 80 of the sill plate 38 is pivotably mounted to an interior wall 245 of the bottom center rail member 70 which has an exterior wall 243 facing outwardly from the doorway 12, and a free end 230 of the center sill plate 80 rests against the top surface of the existing sill plate 260 with a top surface 236 of the center sill plate 80 bridging the distance between the free end 260 and the bottom center rail member 70. The end 240 of the center sill plate 80 defines a concave pocket 242 that extends downwardly and away from the top surface 236, and the free end of the pocket 242 terminates in an arcuate tongue 244. The bottom center rail member 70 defines a projection 246 adjacent to the top of the interior wall 245 which is sized and configured complementarily to the pocket 242 such that the projection 246 is pivotably engaged within the pocket 242. Between the projection 246 and a lower surface of the interior wall 245, the bottom center rail member 70 defines an open arcuate slot or channel 248 which terminates at a terminal end.

The center sill plate 80 is movably, e.g., pivotably, mounted to the bottom center rail member 70 by engaging the projection 246 within the pocket 242 with the arcuate tongue 244 extending into the arcuate channel 248. The center sill plate 80 is then pivotable about an axis defined longitudinally and centrally through the projection 246 and the channel 248 such that the free end 230 of the center sill plate 80 is movable between a position in which the tongue 244 just engages the opening of the channel 248 and a position in which the tongue 244 abuts the terminal end of the channel 248. As illustrated in FIG. 7A, for example, the free end 230 of the center sill plate 80 rests against an existing sill plate 260 that is flush with the bottom rail 34, e.g., a front wall of the existing sill plate 260 abuts the interior wall 245 of the bottom center rail member 70. As another example, the free end 230 of the center sill plate 80 may rest against an existing sill plate 260 that is not flush with the bottom rail 34, e.g., wherein a gap exists between the front wall of the existing sill plate 260 and the interior wall 245 of the bottom center rail member 70. As still another example shown in FIG. 7B, the free end 230 of the center sill plate 80 is moved downwardly into contact with the floor 250 of the doorway 12 in an embodiment which does not include the existing sill plate 260. In any case, the center sill plate 80 may be secured in position by advancing one or more conventional fixation elements through the channel 81A and/or 81B and into engagement with the underlying structure, e.g., the existing sill plate 260 as illustrated by example in FIG. 7A or the floor 250 as illustrated by example in FIG. 7B. Because the ends of the bottom center rail 70 are axially movable with and relative to the end caps 72 and 74, the bottom center rail 70 is still movable in its axial direction with the center sill plate 80 so anchored to the underlying structure, as the projection 246 extending from the bottom center rail 70 may be moved axially along the pocket 242.

Figure 7B:
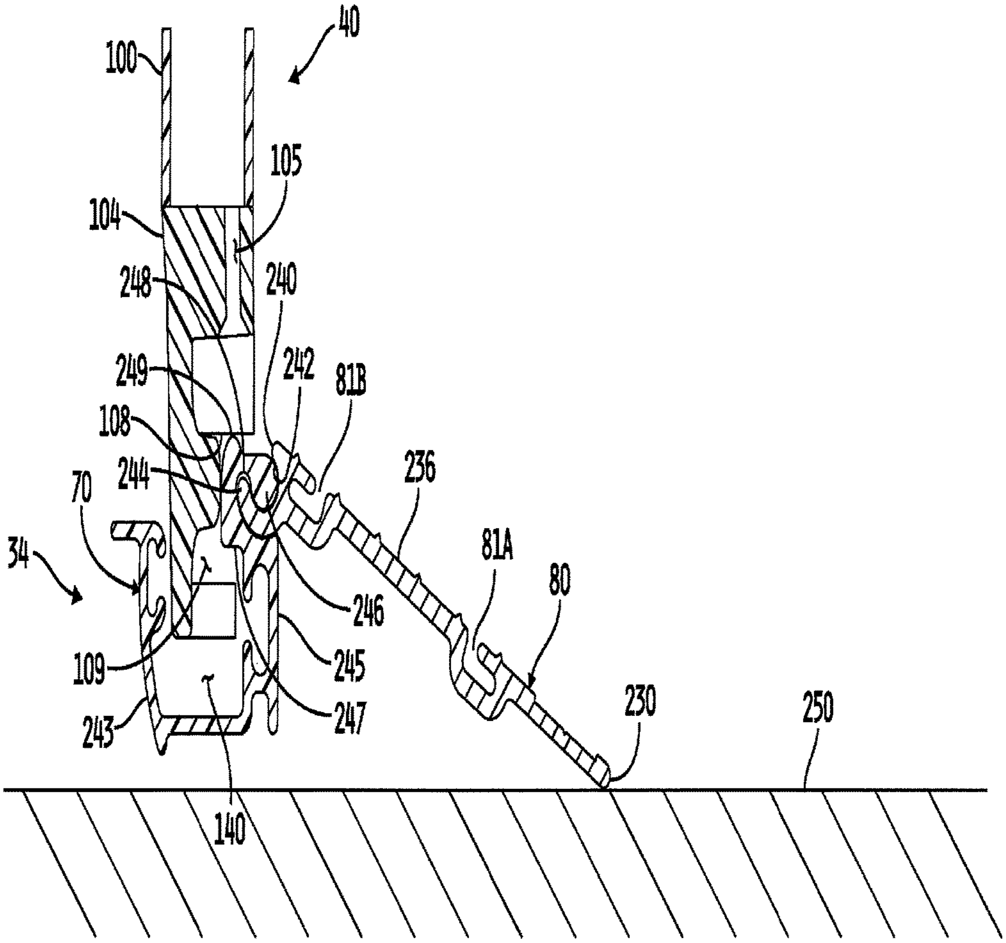
FIG. 7B is a cross-sectional view, along section lines 7-7 of FIG. 1, illustrating the free end of the pivotable sill of the retractable flexible-panel door of FIGS. 1-6 in contact with a floor of a doorway to which the retractable flexible-panel door is mounted.

In the cross-sectional view illustrated in FIGS. 7A and 7B, the channel 140 defined longitudinally through the bottom center rail member 70 as described above with respect to FIGS. 4A-5B is shown between the upwardly extending exterior wall 243 and the upwardly extending interior wall 245 of the bottom center rail member 70. The bottom handle member 104 defines a channel 109 between the one or more protrusions 106 and a generally horizontal interior surface 108 of the bottom handle member 104, and the inner surface of the interior wall 245 of the bottom center rail member 70 defines a generally horizontal surface 247 between the channel 140 and the top 249 of the interior wall 245. The bottom handle member 104 is engaged with and within the bottom center rail member 70 by extending the one or more protrusions 106 into the channel 140 such that the one or more protrusions 106 are trapped below the horizontal surface 247 of the interior wall 245 while the horizontal surface 108 of the bottom handle member 104 rides along the top surface 249 of the interior wall 245 of the bottom center rail 70 as the handle 40 is moved along the channel 140 between the side rails 30, 32. The top handle member 102 and the top rail 36 are identical in structure and operation except that the one or more projections 106 of the top handle member 102 ride along the horizontal surface 247 of the top center rail member 90 as the handle 40 is moved along the channel 140 between the side rails 30, 32.

Figure 8:
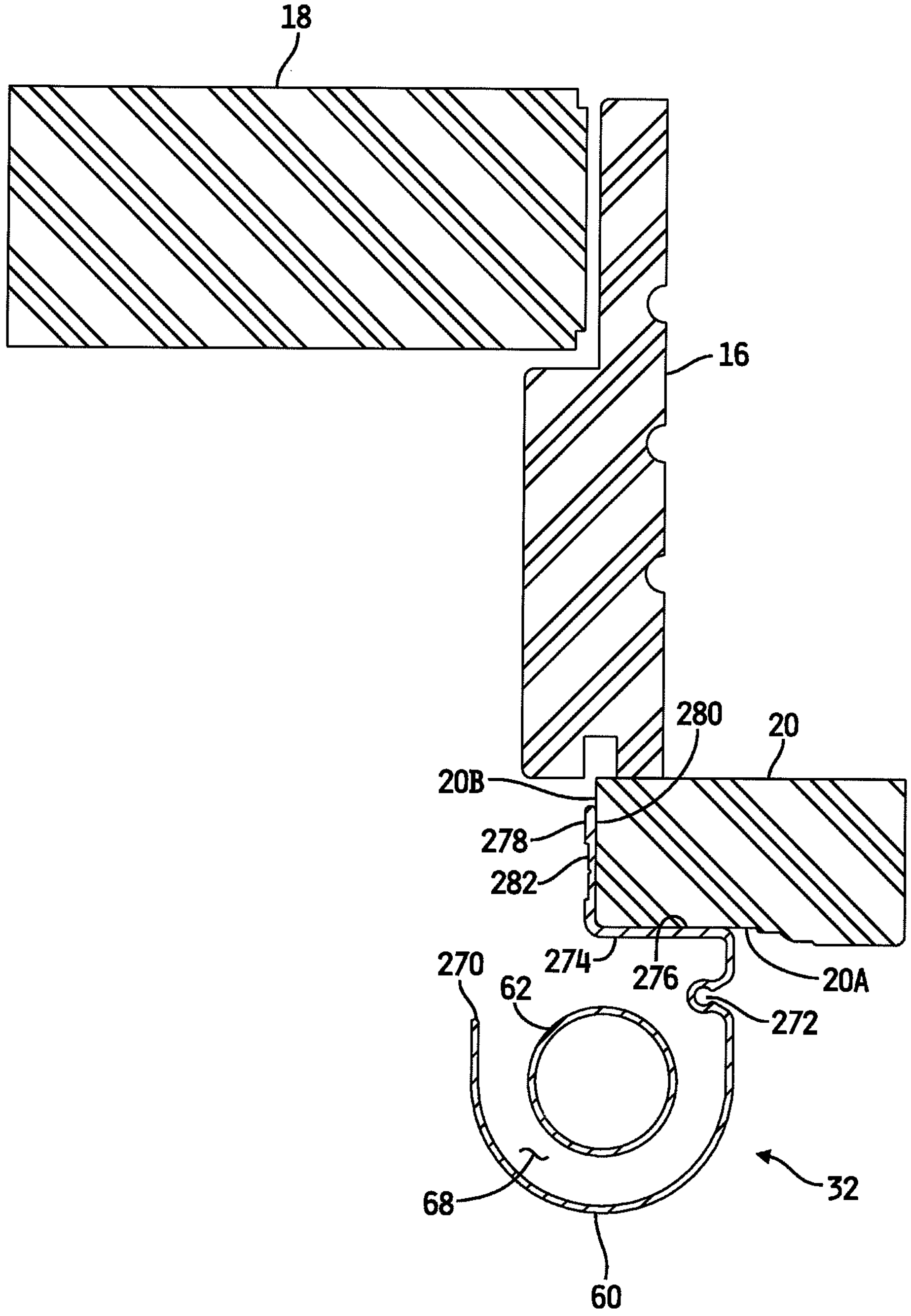
FIG. 8 is a cross-sectional view, along section lines 8-8 of FIG. 1, illustrating details of a mounting arrangement for mounting the barrel housings to a conventional brick molding of the doorway.

Referring now to FIG. 8, a cross-sectional view, along section lines 8-8 of FIG. 1, is shown illustrating details of a mounting arrangement for mounting the barrel housing 60 to the brick molding 20 of the doorway 12. In one embodiment, the barrel housing 50 is a mirror image of the barrel housing 60, and is mounted to the brick molding 20 on an opposite side of the doorway 12 identically as described here. In other embodiments, the barrel housings 50 and 60 may differ in design since only one of the housings 50, 60 need accommodate passage thereby of the flexible panel 42. For example, the housing 50 may be identical to the housing 60 illustrated in FIG. 8 to accommodate the flexible panel 42, and the housing 60 may be a closed housing or otherwise differ in design from the housing 50. In any case, the barrel housing 60 illustrated in FIG. 8 has a free end 270 and the housing 60 is generally arcuately shaped from the free end 270 to a an intermediate wall 274 such that the housing 60 defines a generally arcuate channel 68 between the free end 270 and the intermediate wall 274 with an outer surface 276 of the intermediate wall 274 substantially normal to the outer surface of the region of the housing 60 just prior to the transition to the intermediate wall 274. The channel 68 is sized to receive therein the elongated barrel 62 as illustrated in FIG. 8. Adjacent to the generally flat wall 274, the housing 60 defines a channel 272 which aligns with an opening in the end caps 74 and 94, and the channel 272 and such openings in the end caps 74, 94 are sized and configured to receive and engage a conventional fixation element for securing the barrel housing 60 to the end caps 74, 94.

The brick molding 20 defines an outwardly facing, generally flat outer surface 20A, and another generally flat outer surface 20B that is normal to the flat surface 20A. The housing 60 defines a terminal wall 278 which extends from the intermediate wall 274, and the terminal wall 278 defines a generally flat inner surface 280 that is substantially normal to the generally flat outer surface 276 of the intermediate wall 274. The outer surface of the terminal wall 278 defines a channel 282 through which one or more conventional fixation elements may pass and engage the brick molding 20 to mount the barrel housing 60 to the brick molding 20. The barrel housing 60 is mounted to the brick molding 20 by bringing the inner surface 280 of the terminal wall 278 into contact with the outer surface 20B of the brick molding 20 along the entire length of the barrel housing 60 and the brick molding 20 while at the same time bringing the outer surface 276 of the intermediate wall 274 into contact with the outer surface 20A of the brick molding 20 along the entire length of the barrel housing 60, and then advancing one or more fixation elements through the channel 282 and into engagement with the brick molding, e.g., by advancing a plurality of spaced apart fixation elements through the channel 282 along the length of the barrel housing 60. This structure and mounting arrangement of the barrel housing 60 allows the barrel housings 50, 60 to conform to the shape of the brick molding 20 and thereby accommodates the mounting of the door 10 to brick moldings 20 that are true and that are out of true.

Figure 9:
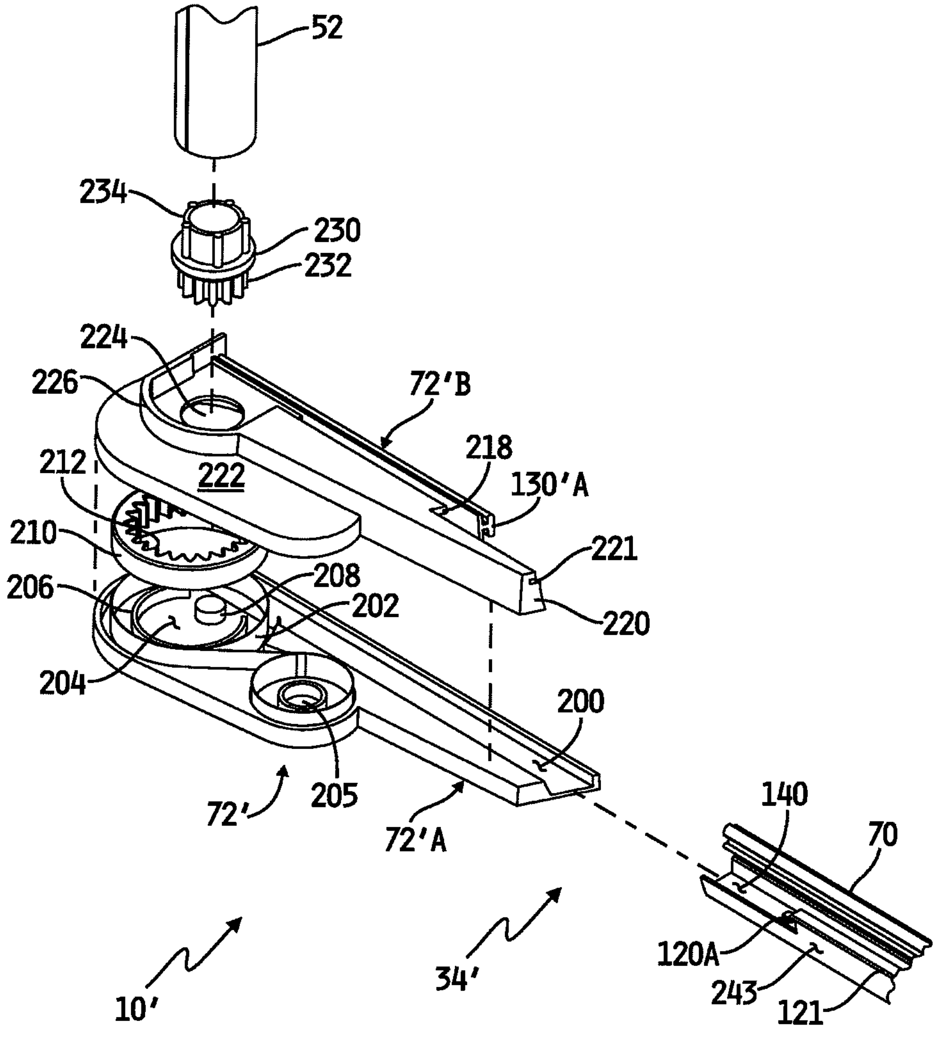
FIG. 9 is a magnified view, similar to FIG. 4B, showing an alternate embodiment of an interface between the barrel and one of the lower end portions of the bottom rail in an alternate embodiment of a retractable flexible-panel door.
Figure 10:
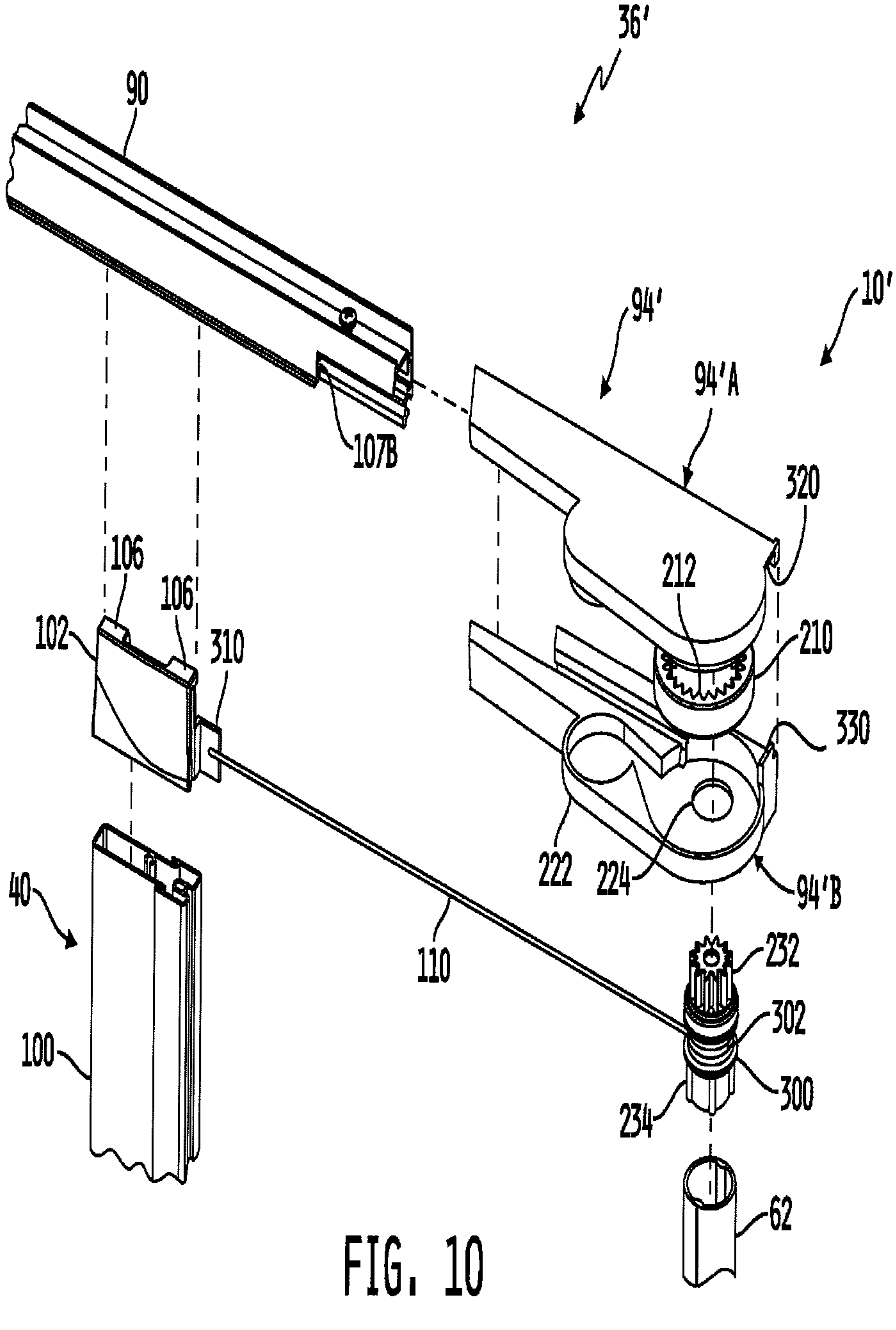
FIG. 10 is a magnified view, similar to FIG. 5A, showing an alternate embodiment of an interface between the post and upper end cap in the alternate embodiment of a retractable flexible-panel door illustrated in FIG. 9.

Referring now to FIGS. 9 and 10, an alternate embodiment of a retractable, flexible-panel door 10' is shown which is substantially identical in structure and operation to the door 10 illustrated in FIGS. 1-8 with the exception of the end caps 72', 74', 92' and 94' and the mechanisms for biasing and rotating the barrels 52, 62 relative to these end caps. Referring specifically to FIG. 9, the end cap 72' includes a base end cap 72'A and a cover end cap 72'B. The base end cap 72'A defines a channel 200 which is sized and oriented to mate with the channel 140 defined by the bottom center rail 70 such that the channels 140 and 200 together define a continuous channel when the base end cap 72'A engages the bottom center rail 70. The base end cap 72'A further defines a biasing member pocket 204 sized and configured to carry a biasing member 202, a biasing member terminal post 205 and a rotational axis post 208. The biasing member pocket 204 is sized to receive therein a biasing member take up drum 210 having an inner surface defining a plurality of gear teeth 212 about the drum 210.

The cover end cap 72'B is attachable to the base end cap 72'A and defines a terminal end 220 defining a channel 221 that is sized to receive therein a flange 121 extending from the notched portion 120A of the bottom center rail 70 longitudinally along an outer surface of the external wall 243 of the bottom center rail 70 when the cover end cap 72'B is brought into engagement with the bottom center rail 70. The cover end cap 72'B also defines a notched portion 130'A which is aligned with the terminal end of the internal wall 245 of the bottom center rail 70 when the cover end cap 72'B is brought into engagement with the bottom center rail 70. These features, together with the channel 200 defined by the base end cap 72'A, allow the width of the bottom rail 34' to be variably adjusted, as described above with respect to the bottom and top rails 34, 36 of the door 10, wherein the position of the end cap 72' relative to the bottom center rail 70 is movable between a minimum width position in which the notched portion 120A of the bottom center rail 70 abuts a notched portion 218 of the cover end cap 72'B and a maximum width position in which the flange 121 is advanced into the channel 221 just past the terminal end 220 of the cover end cap 72'A.

The cover end cap 72'B further defines a body 222 defining an opening 224 therethrough which is partially surrounded by a rib or ridge 226. A gear 230 defines a plurality of teeth 232 extending about the gear 230 at one end thereof, and a mounting flange 234 extending away from an opposite end thereof. The mounting flange 234 is sized and configured to be received within and into engagement with the barrel 52 such that the gear 230 is affixed to and rotates with the barrel 52. The plurality of teeth 232 surround a recess defined in the corresponding end of the gear 230 that is sized to receive therein the rotational axis post 208 such that the gear 230 is rotatable bout the rotational axis post 208, with the rotational axis post 208 defining centrally therethrough a rotational axis about which the gear 230 and the barrel 52 rotate.

In the assembly of the end cap 72', one end of the biasing member 202 engages the terminal post 205, and the other end engages the biasing member take up drum 210 positioned within the biasing member pocket 204 with the rotational axis post 208 positioned within the inner open area of the biasing member take up drum 210. The gear teeth 232 extend through the opening 224 of the cover end cap 72'B and the recess defined by the gear 230 about the teeth 232 is received on the rotational axis post 208 with some of the gear teeth 232 meshing with some of the gear teeth 212 defined on the inner surface of the biasing member drum 210. The biasing member 202 in the embodiment shown in FIG. 9 is illustratively a flat spring, and the combination of the flat spring 202, the terminal post 205 and the biasing member take up drum 210 define a so-called spring motor configured to bias the biasing member take up drum 210 for rotation in one direction, e.g., either clockwise or counter clockwise. In the illustrated embodiment, the flat spring 202 is illustratively a constant-force spring, as described above, and the illustrated spring motor is thus a constant-force spring motor.

In operation, the rotational biasing force applied by the spring 202 to the biasing member take up drum 210 is applied to the gear 230, via the gear teeth 212 and 232, and thus to the barrel 52. As the biasing member take up drum 210 rotates under the force of the spring 202, engagement of the gear teeth 212 of the take up drum 210 with the gear teeth 232 of the gear 230 causes the gear 230, and thus the barrel 50, to rotate. Illustratively, the bottom rail 34' includes an end cap 74' at the opposite end of the bottom center rail 70 that is a mirror image of end cap 72' in structure and operation.

Referring now specifically to FIG. 10, the end cap 94' includes a base end cap 94'A and a cover end cap 94'B that is attachable to the base end cap 94'A. The base end cap 94'A and cover end cap 94'B are identical in structure and operation to the base end cap 72'A and cover end cap 72'B just described with respect to FIG. 9. The base end cap 94'A and cover end cap 94'B are thus together attachable to the top center rail 90 in a manner that allows the position of the end cap 94' relative to the top center rail 90 to be varied to accommodate doorways 12 of varying width. The base end cap 94'A further defines a biasing member pocket identical to that just described with respect to FIG. 9 which carries a biasing member 202, a biasing member terminal post 205 and a rotational axis post 208, and the biasing member pocket is sized to receive therein the take up drum 210 defining a plurality of gear teeth 212.

In the embodiment illustrated in FIG. 10, a gear 300, similar to the gear 230 illustrated in FIG. 9, defines the plurality of teeth 232 extending about the gear 300 at one end thereof, and the mounting flange 234 extending away from an opposite end thereof. As described with respect to FIG. 9, the mounting flange 234 is sized and configured to be received within and into engagement with the barrel 62 such that the gear 300 is affixed to and rotates with the barrel 62, and the plurality of teeth 232 surround a recess defined in the corresponding end of the gear 300 that is sized to receive therein the rotational axis post carried by the base end cap 94'A such that the gear 300 is rotatable bout this rotational axis post, with this rotational axis post defining centrally therethrough a rotational axis about which the gear 300 and the barrel 62 rotate. In addition to these features, the gear 300 further includes a spool 302 positioned between the gear teeth 232 and the flange 234, and the spool 302 is sized and configured to attach to one of the cord 110 described above with respect to FIGS. 2-5B and to permit winding of the cord 110 thereupon and unwinding of the cord 110 therefrom as the handle 40 is moved between the side rails 30, 32. The opposite end of the cord 110 is attached to a tab 310 that engages the top handle member 102.

The base end cap 94'A also illustratively defines a notched portion 320, and the cover end cap 94'B defines a tab 330, wherein the tab 330 aligns with and is received by the notched portion 320 to act as an alignment mechanism for attaching the cover end cap 94'B to the base end cap 94'A. In all other respects, the structure and operation of the end cap 94' is identical to that of the end cap 72' illustrated and described with respect to FIG. 9 and, illustratively, the top rail 36' includes an end cap 92' at the opposite end of the top center rail 90 that is a mirror image of the end cap 94' in structure and operation.

Referring now to FIGS. 11-16B, another embodiment of a flexible-panel door 100 is shown. The flexible-panel door 100 is similar in many respects to the flexible-panel door 10 illustrated and described with respect to FIGS. 1-10, and like components are identified with like reference numbers. For example, the sill plate 38, including the center sill plate 80 and sill extensions 82 and 84 are as illustrated and described above. Moreover, several of the features illustrated and described above with respect to the flexible-panel door 10 are also included in the flexible-panel door 100 although some of the structural components of the flexible-panel door 100 are different from those of the flexible-panel door 10 as will be described below.

Figure 11:
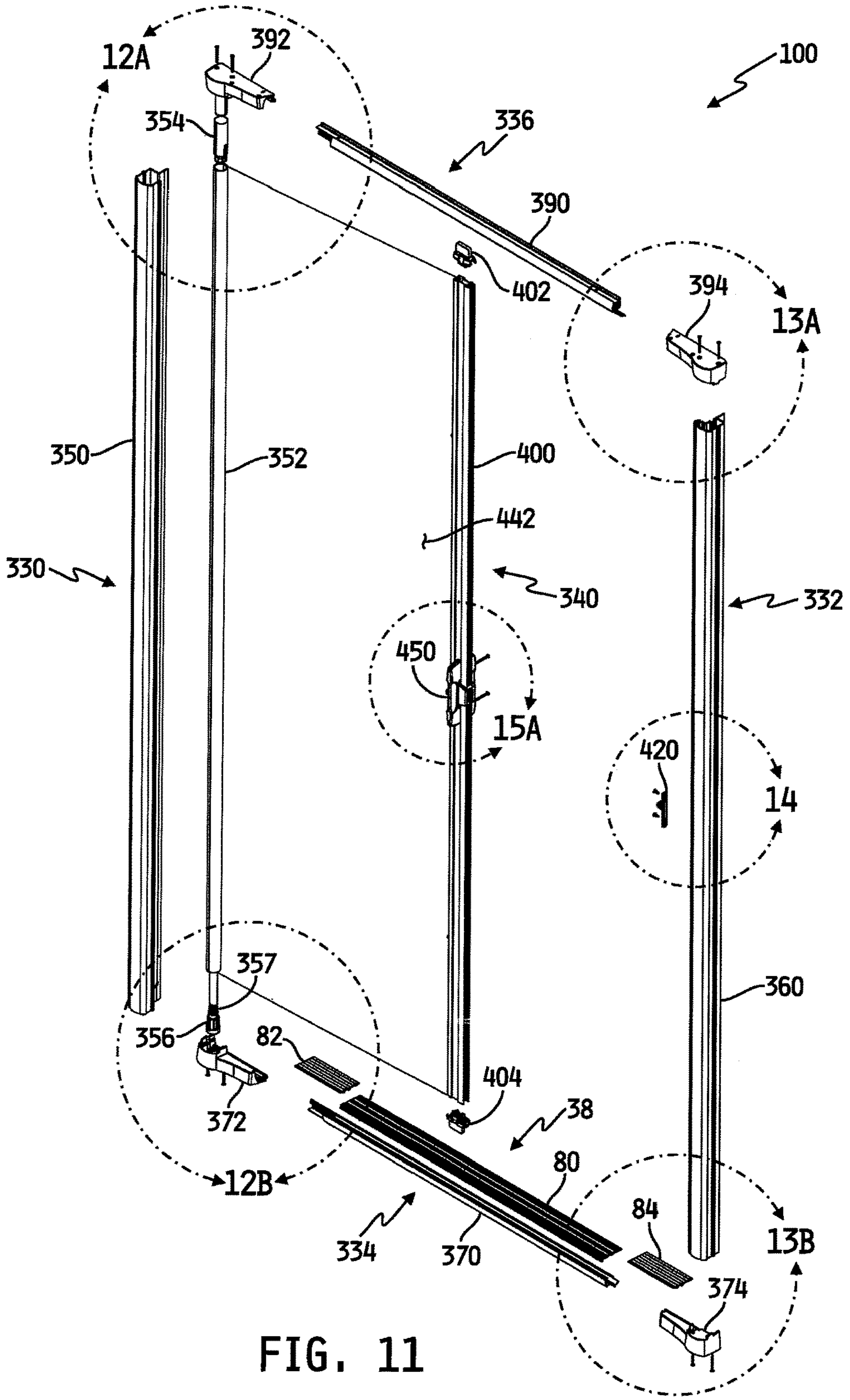
FIG. 11 is an exploded perspective view of another embodiment of the retractable flexible-panel door of FIG. 1.

Referring specifically to FIG. 11, the flexible-panel door 100 includes a pair of opposing side rails 330, 332, a bottom rail 334 extending between and operatively connected to bottom ends of each side rail 330, 332 and a top rail 36 extending between and operatively connected to top ends of each side rail 330, 332. The adjustable sill plate 38 illustrated and described above is operatively connected to the bottom rail 334 along an inner side thereof, and is adjustable both in length and in incline relative to the bottom rail 334 as also described above. One end of an elongated door guide 400 is slidably received within the bottom rail 334, and an opposite end of the door guide 400 is slidably received within the top rail 336 such that the door guide 400 is movable between the two side rails 330, 332.

The side rail 330 includes an elongated barrel housing 350 and an elongated, rotatable barrel 352. At least a portion of one side of a flexible panel 442 is attached to one side of the door guide 400, and at least a portion of an opposite side of the flexible panel 442 is attached to the rotatable barrel 352. The barrel housing 350 and barrel 352 are sized and configured such that, in assembled form, portions of the barrel housing 350 extend about the barrel 352 to hide it from view while also allowing the flexible panel 442 to freely move into and out of the housing 350. The side rail 332 likewise includes an elongated housing 360. In the illustrated embodiment, the side rail 332 does not include an elongated barrel, and the elongated housing 360 illustrated in FIG. 11 accordingly is not configured to receive or carry an elongated barrel. However, in some alternate embodiments, the side rail 332 may include an elongated barrel identical or similar to the elongated barrel 352, and in such embodiments the elongated housing 360 may therefore be configured similarly or identically to the barrel housing 350. and in the illustrated embodiment the side rail 332 does not include a rotatable barrel.

The bottom rail 334 includes a center rail member 370 mounted at each opposing end to an end portion or end cap 372, 374, and the top rail 336 likewise includes a center rail member 390 mounted at each end to an end portion or end cap 392, 394. As with the embodiment 10 illustrated and described above with respect to FIGS. 1-10, the center rail member 370 and two corresponding end caps 372, 374 of the bottom rail 334, as well as the center rail member 390 and two corresponding end caps 392, 394 of the top rail 336, are designed to be movable relative to each other along the longitudinal axes of the top and bottom rail members 370, 390 respectively such that the total lengths of each of the bottom and top rails 334, 336 are adjustable to accommodate different width doorways 12. In one embodiment, these components are illustratively designed to allow the lengths of the bottom and top rails 334, 336 to be adjustable to accommodate doorways 12 having doors 18 of between approximately 32-36 inches, although the foregoing components may alternatively be designed to allow for adjustment between other lengths and/or ranges of lengths.

At least a portion of one side of the flexible panel 442 is attached to one side of the door guide 400, and at least a portion of an opposite side of the flexible panel 442 is attached to the rotatable barrel 352 carried by the side rail 330. The flexible panel 442 is paid out from, i.e., is drawn away from, the barrel 352 as the door guide 400 is moved away from the barrel 352 toward the opposite side rail 332 and, as will be described in greater detail below, the barrel 352 carried by the side rail 330 is biased such that the flexible panel 442 wraps around the barrel as the door guide 400 moves toward the side rail 330. In the embodiment illustrated in FIG. 11, the flexible panel 442 extends between the left-most side rail 330 and the door guide 400, although the structural features and modular construction of the flexible-panel door 100 allow it to be mounted such that the panel 442 may extend between the right-most side rail and the door guide 400, as will be described in greater detail below. While the flexible panel 442 is illustrated in FIG. 11 as a transparent panel, this has been done only for the purpose of providing an unobstructed view of various components of the door 100, and this illustration of the flexible panel 442 therefore should not be considered to be limiting in any way.

Figure 16A:
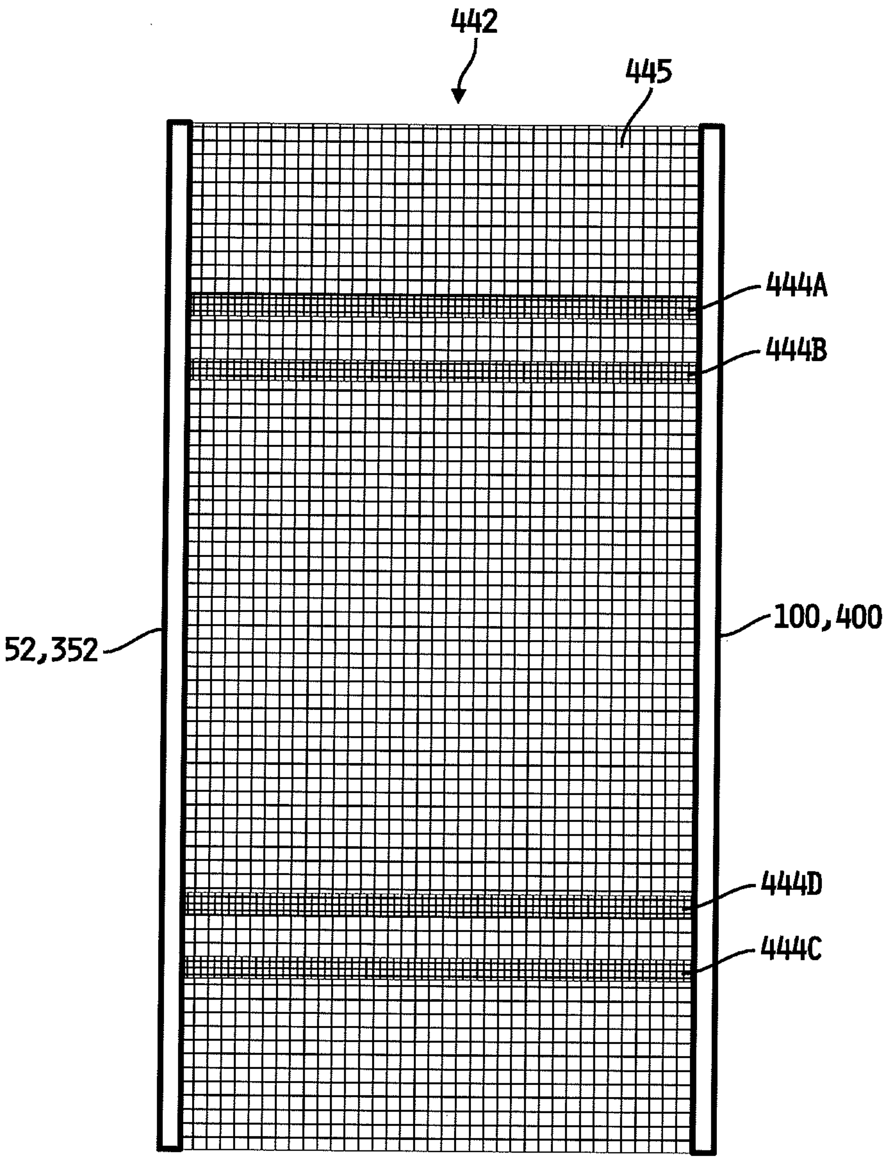
FIG. 16A is a front plan view of one embodiment of a flexible panel that may be implemented with any embodiment of the flexible-panel door.
Figure 16B:
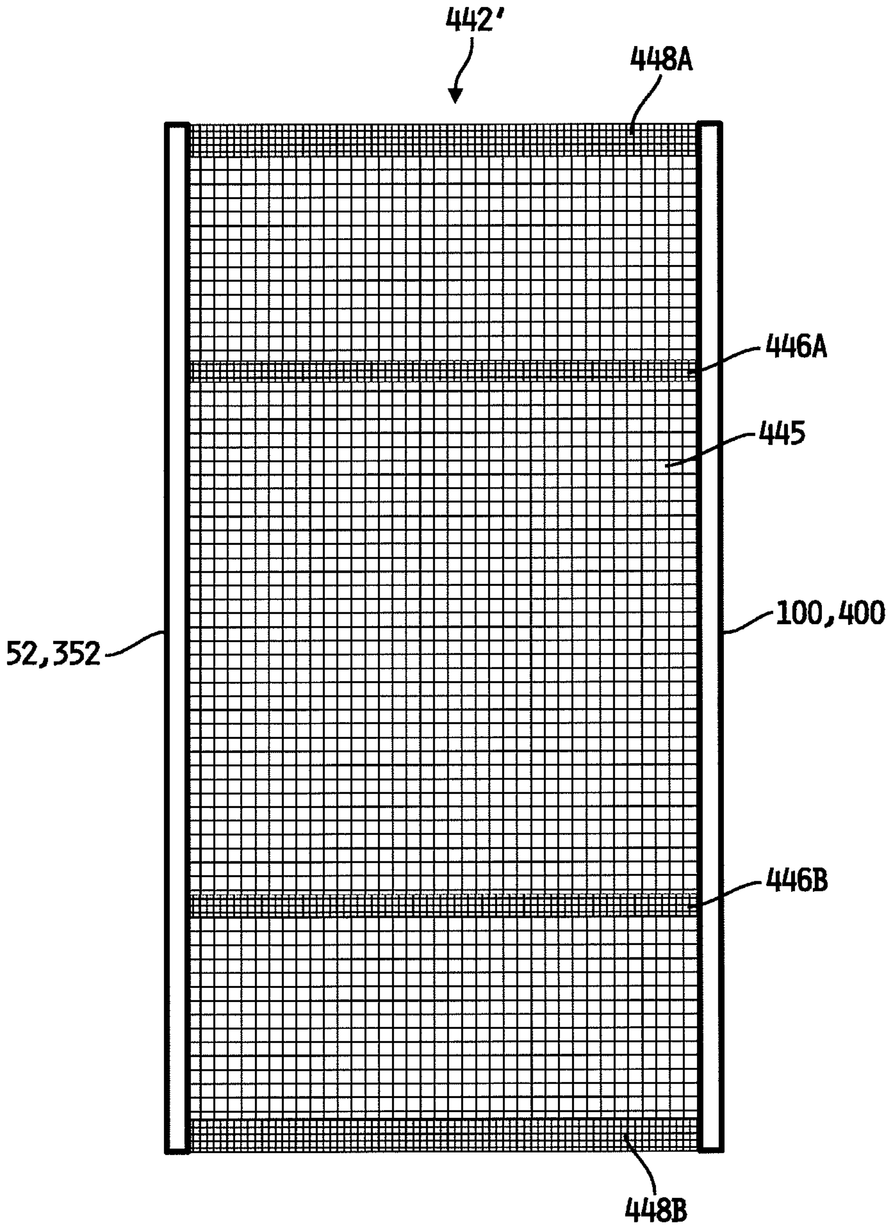
FIG. 16B is a front plan view of another embodiment of a flexible panel that may be implemented with any embodiment of the flexible-panel door.

In the illustrated embodiment, one side of the flexible panel 442 is attached along its entire length to one side of the door guide 400, and the opposite side of the flexible panel 442 is attached along its entire length to the rotatable barrel 352, although it will be understood that either or both sides of the flexible panel 442 may alternatively be attached to its corresponding structure only partially along its length. In any case, the flexible panel 442 may be partially or completely porous, partially porous or non-porous, and one or more portions, or all, of the flexible panel 442 may be transparent, translucent or completely opaque. The flexible panel 442 may be provided in the form of any flexible material, or combination of flexible materials, capable of being wound around, and paid out from, a rotatable barrel carried by one the side rail 330. Examples of such one or more flexible materials include, but should not be limited to, metal, metal composite, fabric, synthetic or semi-synthetic moldable, i.e., plastic, material, or the like, and one or more coatings, e.g., waterproof or otherwise, may be applied to any such material(s) making up the flexible panel 442. Two example embodiments of the flexible panel 442, provided in the form of a screen mesh material, are illustrated in FIGS. 16A and 16B, and will be described below.

As described in detail above, the center sill plate 80 and the pair of sill extensions 82 and 84 slidably mountable to opposite ends respectively of the sill plate 80 are, like the components making up the top and bottom rails 334, 336, illustratively designed to allow the total length of the sill plate 38 to be adjustable along its longitudinal axis to accommodate different width doorways 12. In the embodiment illustrated above by example, the sill plate 80 and the sill extensions 82, 84 are illustratively designed to allow the lengths of the sill plate 38 to be adjustable to accommodate doorways 12 having doors 18 of between approximately 32-36 inches, although the foregoing components may alternatively be designed to allow for adjustment between other lengths and/or ranges of lengths.

In the embodiment illustrated in FIG. 11, the door 100 further includes a biasing member connector 356 coupled near a bottom end of the barrel 352 between a biasing member 357 carried by the barrel 352 and the end cap 372 of the bottom rail 334, and a conventional speed governor 354 coupled between the top end of the barrel 352 and the end cap 392 of the top rail 336. The biasing member 357 is illustratively affixed to the barrel 352, and the biasing member connector 356 is affixed to the biasing member 357 and rotationally mounted to the end cap 372. The speed governor 354 is affixed to the top end of the barrel 352 and also to the end cap 392. The biasing member 357 operates to bias the barrel 352 for rotation, relative to the end caps 392, 372 of the top rail 336 and bottom rail 334 respectively, about a longitudinal axis defined through the barrel 352. In one embodiment, the biasing member 357 is provided in the form of a single, conventional helical spring having a size, stiffness and spring constant selected to operate generally in a linear force-producing region of the spring and to apply a desired rotational force on the barrel 352. In alternative embodiments, the biasing member 357 may be provided in the form of multiple conventional helical springs, one or more non-helical springs or one or more other conventional biasing members. The speed governor 354 operates to dampen the rate of rotation of the barrel 352 about its longitudinal axis, relative to the end cap 372 of the top rail 336, such that an average rotational force applied by the biasing member 357 to the barrel 352 is within a desired range. In one embodiment, the speed governor 354 is a conventional mechanical device, although in alternate embodiments the speed governor 354 may include conventional fluid, gel and/or other conventional components to dampen the rotational rate of the barrel 352.

Illustratively, the rotational components 354 and 356 are designed to operate identically whether mounted to the top end of the barrel 352 or the bottom end of the barrel 352. In this regard, the positions of such components may therefore be reversed such that the speed governor 354 is positioned between the bottom of the barrel 352 and the end cap 372 of the bottom rail 334, and the biasing member connector 356 is positioned between the top of the barrel 352 and the end cap 392 of the top rail 336. Moreover, such reversibility of the rotational components 354 and 356 further facilitates invertible mounting of the side rails 330, 332 to the door frame 16 to accommodate reversible mounting of the door 100 within a doorway 12, e.g., right hand or left hand opening of the flexible panel door 100 relative to the doorway 12, as will be described in greater detail below.

In the embodiment illustrated in FIG. 11, the door guide 340 includes a center handle member 400 attachable at its top end to a top handle member 402, and attachable at its bottom end to a bottom handle member 404. The top handle member 402 and the bottom handle member 404 are each illustratively configured identically as described above with respect to the top and bottom handle members 102 and 104 respectively, in that the top handle member 402 is configured to slidably engage the center rail member 390 of the top rail 336 and the bottom handle member 404 is likewise configured to slidably engage the center rail member 370 of the bottom rail 334 such that the door guide 400 is coupled to, i.e., engaged with, and is movable along the length of, the center rail members 370 and 390.

In the illustrated embodiment, the door 100 further includes a handle 450 mounted to the door guide 400 and a latch hook 420 mounted to the side rail 332 of the door 100. The door handle 450 is configured to releasably engage the latch hook 420 when the door guide 400 is adjacent to the side rail 332 for the purpose of maintaining the door guide 400 in a closed position relative to the side rail 332 against the biasing force of the biasing member 357 urging the door guide 400 toward the side rail 330. When the door handle 450 is released from the latch hook 420, the biasing force of the biasing member 357 draws the door guide 400 back toward the side rail 330 unless a force greater than or equal to the force of the biasing member 357 acts on the door guide 400 in the opposite direction, i.e., in a direction toward the side rail 332. As will be described in greater detail below with respect to FIGS. 15A-15C, the door handle 450 includes a latching mechanism, configured to releasably engage the latch hook 420, that is biased toward a center position relative to the door guide 400 yet movable both upwardly and downwardly from the center position. This bi-direction, self-centering feature of the door handle 450 facilitates invertible mounting of the door guide 400 to the top and bottom rails 336, 334 respectively, further accommodating reversible mounting of the door 100 within a doorway 12, e.g., right hand or left hand opening of the flexible panel door 100 relative to the doorway 12.

Figure 12A:
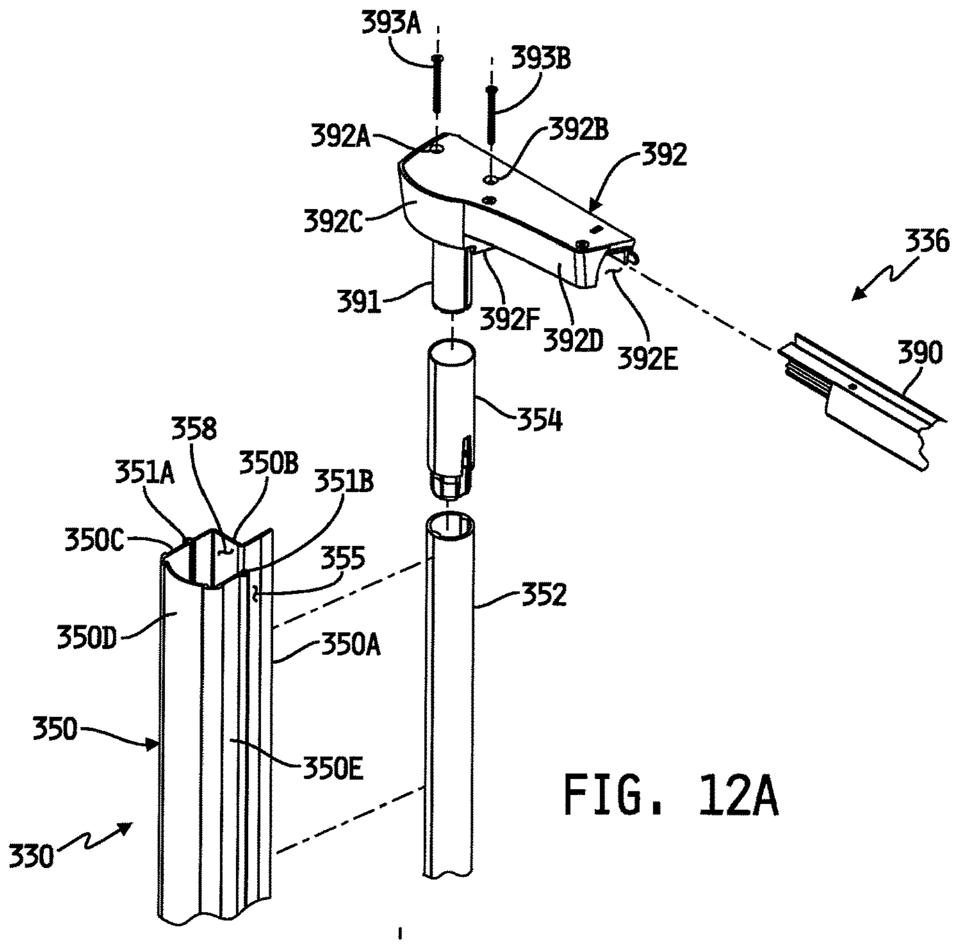
FIG. 12A is a magnified view of the portion of the retractable flexible-panel door of FIG. 11 contained within the dashed-line region 12A.

Referring now to FIG. 12A, a magnified view is shown of the portion of the retractable flexible-panel door 100 of FIG. 11 contained within the dashed-line region 12A. In the illustrated embodiment, the speed governor 354 is configured to be mounted at a lower end to the barrel 352, and its top is configured to receive a protrusion 391 extending from, and affixed to, a base 392C of the end cap 392. When assembled, the speed governor 354 is rigidly, i.e., non-movably, mounted to the end cap 392 and to the barrel 352, and any rotational movement of the barrel 352 relative to the end cap 392 is thus subject to the rotation-resisting damping force imparted by thereto by the speed governor 354.

The barrel housing 350 includes a plurality of variously oriented walls defined about a center opening 358 which extends axially through the housing 350 between the top and bottom ends thereof. Between its two opposite ends, the housing 350 defines a first substantially planar wall 350A extending from a first terminal end thereof to a second substantially planar wall 350B, wherein the transition between the two walls 350A and 350B illustratively defines a right angle such that the two walls 350A and 350B are substantially normal to each other. The second wall 350B extends from the first wall 350A to a third wall 350C. The third wall 350C extends from the second wall 350B to a fourth wall 350D, and the fourth wall 350D extends to a fifth wall 350E which terminates away from the fourth wall 350D at a second terminal end. The transitions between the second and third walls 350B, 350C, between the third and fourth walls 350C, 350D, and the fourth and fifth walls 350D, 350E each generally define right angles such that the first and fifth walls 350A, 350E are generally parallel with each other and the first and second terminal ends of the housing 350 extend generally parallel to an axis extending longitudinally through the housing 350. The first and second terminal ends further define an elongated opening 355 therebetween that extends the length of the housing 350. The opening 358 is sized to receive the barrel 352 therein such that the barrel 352 can freely rotate within the housing 350. The opening 355 is sized to allow the flexible panel 442 to freely move therethrough, toward and away from the barrel 352.

As described in detail above with respect to FIG. 8, the first and second walls 350A, 350B are each oriented substantially normally to each other in order to facilitate mounting the housing 350 to a conventional brick molding 20 with the two walls 350A, 350B directly contacting complementarily oriented walls of the brick molding 20 substantially along each of their lengths. Conventional fastening members, e.g., nails or screws, may be passed through the first wall 350A and into such a brick molding 20 at various points along the length of the first wall 350A in order to securely attach the housing 350 to the doorway 12.

The end cap 392 further includes an elongated section 392D extending away from the base 392C, and the elongated section 392D defines a channel 392E therein. The channel 392E is sized and configured to slidably receive therein one end of the top rail member 390. The top rail member 390 is thus axially movable within the channel 392E, i.e., it may be axially advanced, within the channel 392E, toward the base 392C and/or axially retracted, within the channel 392E, away from the base 392C. In the illustrated embodiment, the structural configurations of the channel 392E and the top rail member 390 are identical to those illustrated and described above with respect to FIG. 9, such that the top rail member 390 includes a number of laterally extending flanges that engage within and are axially movable along correspondingly configured lateral slots or channel sections defined by and within the channel 392E. The top rail member 390 and the channel 392E thus engage each other in one or more lateral directions so as to retain the top rail member 390 within the channel 390 at all times while also allowing free axial movement of the top rail member 390 within the channel 392E. It will be understood, however, that the end cap 392 and the top rail member 390 may alternatively be configured such that the channel 392E may include the one or more laterally flanges and the top rail member 390 may define the one or more lateral slots, and/or may be alternatively configured such that the elongated section 392D, or a portion thereof, may be slidably received and engaged within, and axially movable relative to, a channel defined in or by the top rail member 390. Such alternate configurations are intended to fall within the scope of this disclosure.

The base 392C of the end cap 392 further defines a set of bores 392A, 392B therethrough which align, when assembled, with bores 351A and 351B respectively defined into the walls 350C and 350E respectively of the barrel housing 350. Fixation members, e.g., screws, 393A and 393B may be passed through the bores 392A, 392B and into engagement with the bores 351A, 351B to fixedly attach the end cap 392 to the barrel housing 350. The base 392C further defines a pair of tabs (only one, 392F, shown) that align with corresponding features of the barrel housing 350 to facilitate proper positioning of the end cap 392 relative to the housing 350 for mounting and affixing the end cap 392 thereto. For example, the tab 392F is configured and positioned to align with the wall 350E between the bore 351B and a corner piece of the housing defined at the transition between the walls 350D and 350E. The other tab (not shown) is illustratively positioned to align with the wall 350C between the bore 351A and a corner piece of the housing defined at the transition between the walls 350C and 350D.

Figure 12B:
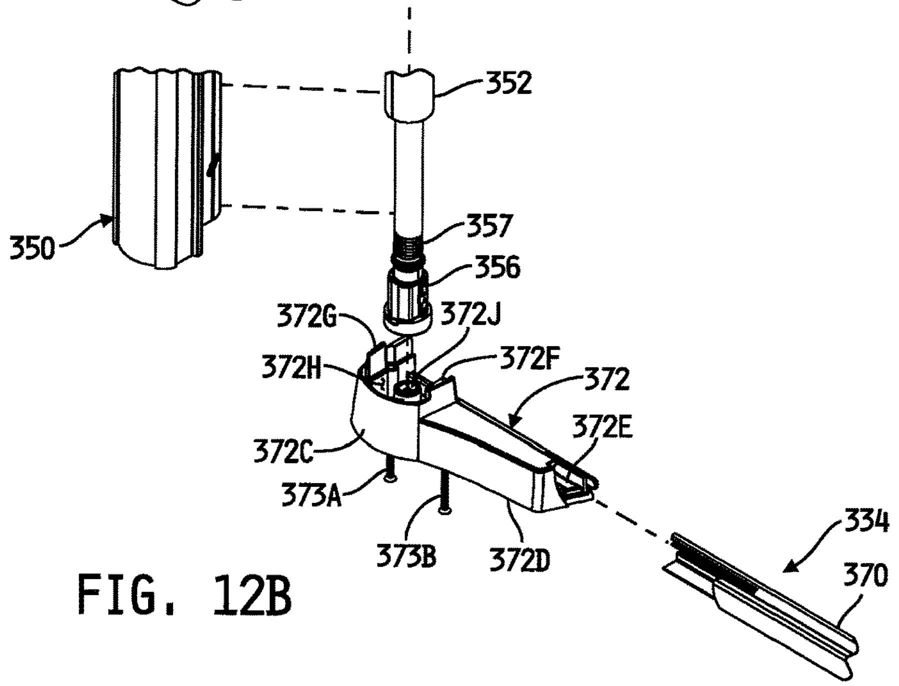
FIG. 12B is a magnified view of the portion of the retractable flexible-panel door of FIG. 11 contained within the dashed-line region 12B.

Referring now to FIG. 12B, a magnified view is shown of the portion of the retractable flexible-panel door 100 of FIG. 11 contained within the dashed-line region 12B. In the illustrated embodiment, one end of the biasing member 357 is affixed to the bottom end of the barrel 352, and the opposite end of the biasing member 357 is affixed to the biasing member connector 356. The end cap 372 includes a base 372C defining a pocket 372H therein and a bearing member 372J extending upwardly from a floor of the pocket 372H. The bearing member 372J is sized and configured to receive thereon an open end of the biasing member connector 356 such that the biasing member connector 356, and thus the barrel 352, is rotatable about the bearing member 372J.

The end cap 372 further includes an elongated section 372D extending away from the base 372C, and the elongated section 372D defines a channel 372E therein. The channel 372E is sized and configured to slidably receive therein one end of the top rail member 370. The channel 372E and the top rail member 370 are sized and configured identically as described with respect to FIG. 12A such that the bottom rail member 370 is laterally retained in but axially movable within the channel 372E, i.e., it may be axially advanced, within the channel 372E, toward the base 372C and/or axially retracted, within the channel 372E, away from the base 372C. It will be understood, however, that the end cap 372 and the bottom rail member 370 may alternatively be configured such that the channel 372E may include the one or more laterally flanges and the top rail member 370 may define the one or more lateral slots, and/or may be alternatively configured such that the elongated section 372D, or a portion thereof, may be slidably received and engaged within, and axially movable relative to, a channel defined in or by the bottom rail member 370. Such alternate configurations are intended to fall within the scope of this disclosure.

The base 372C of the end cap 372 further defines a set of bores (not shown) identical in configuration and position, relative to the base 372C, as the bores 392A, 392B described above with respect to FIG. 12A, such that they align, when assembled, with bores 351A and 351B respectively defined into the walls 350C and 350E respectively of the barrel housing 350. Fixation members, e.g., screws, 373A and 373B may be passed through the bores 372A, 372B and into engagement with the bores 351A, 351B to fixedly attach the end cap 372 to the barrel housing 350. The base 372C further defines a pair of tabs 372F and 372G that align with corresponding features of the barrel housing 350 to facilitate proper positioning of the end cap 372 relative to the housing 350 for mounting and affixing the end cap 372 thereto. For example, the tab 372F is configured and positioned to align with the wall 350E between the bore 351B and a corner piece of the housing defined at the transition between the walls 350D and 350E, and the tab 372G is positioned to align with the wall 350C between the bore 351A and a corner piece of the housing defined at the transition between the walls 350C and 350D.

Figure 13A:
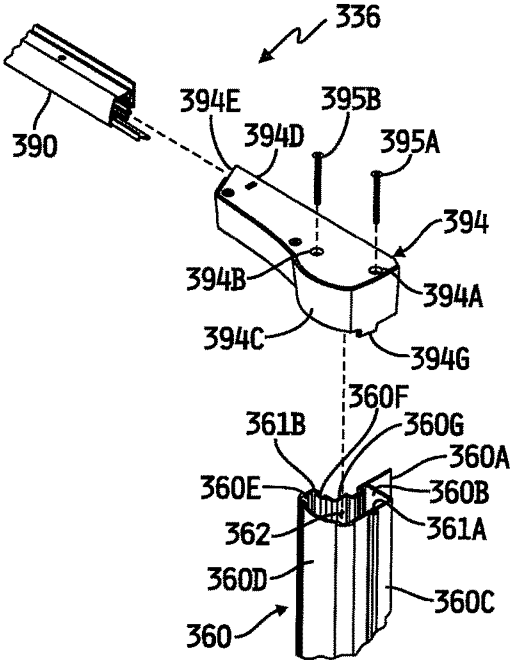
FIG. 13A is a magnified view of the portion of the retractable flexible-panel door of FIG. 11 contained within the dashed-line region 13A.

Referring now to FIG. 13A, a magnified view is shown of the portion of the retractable flexible-panel door 100 of FIG. 11 contained within the dashed-line region 13A. In the illustrated embodiment, the end cap 394 includes a base 394C and an elongated section 394D extending away from the base 394C, and the elongated section 394D defines a channel 394E therein. The channel 394E is sized and configured to slidably receive therein an end of the top rail member 390 opposite to that received within the channel 392E of the end cap 392. The channel 394E and the top rail member 390 are sized and configured identically as described with respect to FIG. 12A such that the top rail member 390 is laterally retained in but axially movable within the channel 394E, i.e., it may be axially advanced, within the channel 394E, toward the base 394C and/or axially retracted, within the channel 394E, away from the base 394C. It will be understood, however, that the end cap 394 and the top rail member 394 may alternatively be configured such that the channel 394E may include the one or more laterally flanges and the top rail member 390 may define the one or more lateral slots, and/or may be alternatively configured such that the elongated section 394D, or a portion thereof, may be slidably received and engaged within, and axially movable relative to, a channel defined in or by the top rail member 390. Such alternate configurations are intended to fall within the scope of this disclosure.

The elongated housing 360 illustratively includes a plurality of variously oriented walls defined about a center opening 362 which extends axially through the housing 360 between the top and bottom ends thereof. Between its two opposite ends, the housing 360 defines a first substantially planar wall 360A extending from a first terminal end thereof to a second substantially planar wall 360B, wherein the transition between the two walls 360A and 360B illustratively defines a right angle such that the two walls 360A and 360B are substantially normal to each other. The second wall 360B extends from the first wall 360A to a third wall 360C. The third wall 360C extends from the second wall 360B to a fourth wall 360D, and the fourth wall 360D extends to a fifth wall 360E. The fifth wall 360E extends from the four wall 360D to a sixth wall 360F, and the sixth wall extends to a seventh wall 360G which terminates substantially at an outer surface of the transition between the first and second walls 360A and 360B. The transitions between the second and third walls 360B, 360C, between the third and fourth walls 360C, 360D, between the fourth and fifth walls 360D, 360E, between the fifth and sixth walls 360E, 360F and between the sixth and seventh walls 360F, 360G each generally define right angles such that the first and seventh walls 360A, 360G are generally parallel and coplanar with each other and such that one end of the seventh wall 360G is joined to the transition between the first and second walls 360A and 360B. The elongated housing 360 thus defines a closed structure about the center opening 362.

As described in detail above with respect to FIG. 8, the first and second walls 360A, 360B are each oriented substantially normally to each other in order to facilitate mounting the housing 360 to a conventional brick molding 20 with the two walls 360A, 360B directly contacting complementarily oriented walls of the brick molding 20 substantially along each of their lengths. Conventional fastening members, e.g., nails or screws, may be passed through the first wall 360A and into such a brick molding 20 at various points along the length of the first wall 360A in order to securely attach the housing 360 to the doorway 12.

The base 394C of the end cap 394 further defines a set of bores 394A, 394B therethrough which align, when assembled, with bores 361A and 361B respectively defined into the walls 360C and 360E respectively of the elongated housing 360. Fixation members, e.g., screws, 395A and 395B may be passed through the bores 394A, 394B and into engagement with the bores 361A, 361B to fixedly attach the end cap 394 to the elongated housing 360. The base 394C further defines a pair of tabs (only one, 392G, shown) that align with corresponding features of the barrel housing 360 to facilitate proper positioning of the end cap 394 relative to the housing 360 for mounting and affixing the end cap 394 thereto. For example, the tab 394G is configured and positioned to align with the wall 360C between the bore 361A and a corner piece of the housing defined at the transition between the walls 360C and 360D. The other tab (not shown) is illustratively positioned to align with the wall 360E.

Figure 13B:
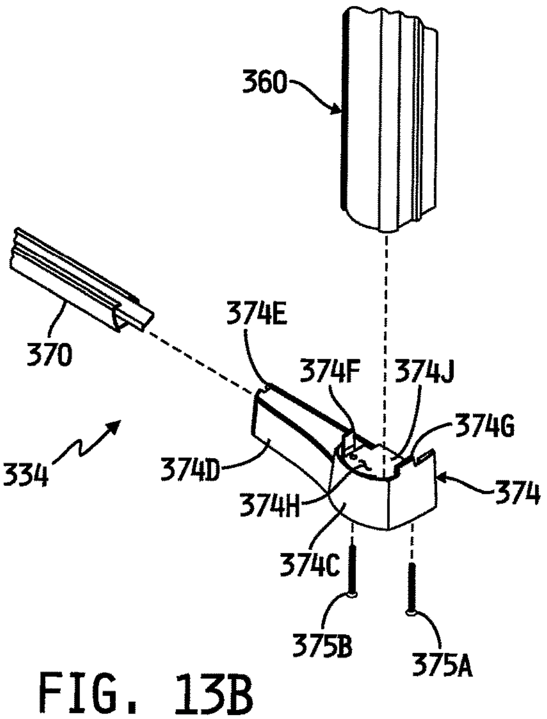
FIG. 13B is a magnified view of the portion of the retractable flexible-panel door of FIG. 11 contained within the dashed-line region 13B.

Referring now to FIG. 13B, a magnified view is shown of the portion of the retractable flexible-panel door 100 of FIG. 11 contained within the dashed-line region 13B. In the illustrated embodiment, the end cap 374 includes a base 374C defining a pocket 374H therein that is sized and configured to receive the end of the housing 360 therein. Although not shown in FIG. 13A, the base 394C of the end cap 394 defines an identical pocket therein. In any case, the end cap 374 further includes an elongated section 374D extending away from the base 374C, and the elongated section 374D defines a channel 374E therein. The channel 374E is sized and configured to slidably receive therein an end of the bottom rail member 370 opposite that received in the channel 372E of the end cap 372. The channel 374E and the bottom rail member 370 are sized and configured identically as described with respect to FIG. 12A such that the bottom rail member 370 is laterally retained in but axially movable within the channel 374E, i.e., it may be axially advanced, within the channel 374E, toward the base 374C and/or axially retracted, within the channel 374E, away from the base 374C. It will be understood, however, that the end cap 374 and the bottom rail member 370 may alternatively be configured such that the channel 374E may include the one or more laterally flanges and the top rail member 374 may define the one or more lateral slots, and/or may be alternatively configured such that the elongated section 374D, or a portion thereof, may be slidably received and engaged within, and axially movable relative to, a channel defined in or by the bottom rail member 370. Such alternate configurations are intended to fall within the scope of this disclosure.

The base 374C of the end cap 372 further defines a set of bores (not shown) identical in configuration and position, relative to the base 374C, as the bores 394A, 394B described above with respect to FIG. 13A, such that they align, when assembled, with bores 361A and 361B respectively defined into the walls 360C and 360E respectively of the elongated housing 360. Fixation members, e.g., screws, 375A and 375B may be passed through the bores defined through the base 374C and into engagement with the bores 361A, 361B to fixedly attach the end cap 374 to the elongated housing 360. The base 374C further defines a pair of tabs 374F and 374G that align with corresponding features of the elongated housing 360 to facilitate proper positioning of the end cap 374 relative to the housing 360 for mounting and affixing the end cap 374 thereto. For example, the tab 374F is configured and positioned to align with the wall 360E, and the tab 374G is positioned to align with the wall 360C between the bore 361A and a corner piece of the housing defined at the transition between the walls 360C and 360D.

Figure 14:
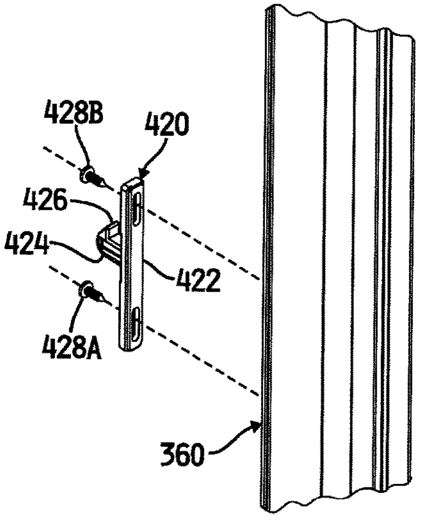
FIG. 14 is a magnified view of the portion of the retractable flexible-panel door of FIG. 11 contained within the dashed-line region 14.

Referring now to FIG. 14, a magnified view is shown of the portion of the retractable flexible-panel door 100 of FIG. 11 contained within the dashed-line region 14. In the illustrated embodiment, the latch hook 420 includes an elongated base 422 which defines a bore therethrough adjacent each end. Fixation members, e.g., screws, 428A and 428B may be passed through the bores defined through the base 422 and into engagement with corresponding bores (not shown) defined into the elongated housing 360 to fixedly attach the latch hook 420 to the elongated housing 360. The latch hook 420 further includes a hook member 424 which extend outwardly and away from the base 422 with a hook defined at the terminal end 426 of the hook member 424. Illustratively, the latch hook 420 may be mounted with the hook 426 oriented upwardly, as illustrated in FIG. 14, or downwardly.

Figure 15A:
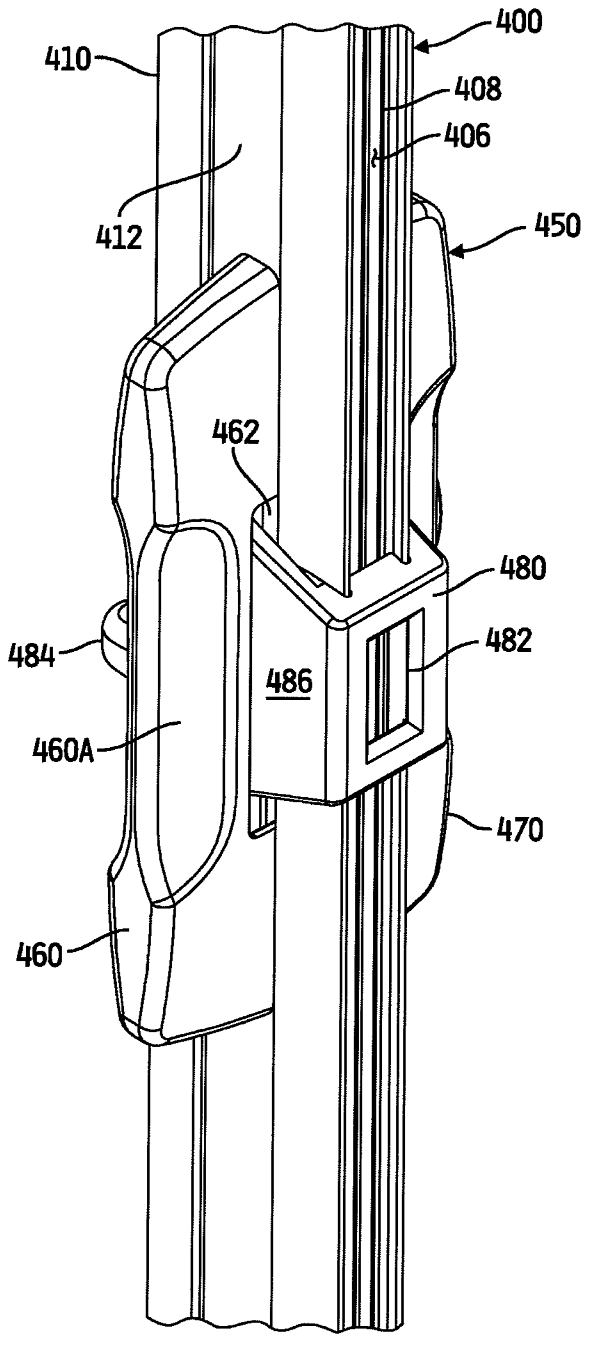
FIG. 15A is a magnified view of the portion of the retractable flexible-panel door of FIG. 11 contained within the dashed-line region 15A.

Referring now to FIG. 15A, a magnified view is shown of the portion of the retractable flexible-panel door 100 of FIG. 11 contained within the dashed-line region 15A. In the illustrated embodiment, and referring also to FIGS. 15B and 15C, the door handle 450 includes a grip member 460 mounted to one side 412 of the door guide 400 and another grip member 470 mounted to an opposite side 414 of the door guide 400. The grip member 460 defines an indented or recessed portion 460A that highlights a gripping area of the grip member 460, and the grip member 470 likewise defines an indented or recessed portion 470A that highlights a gripping area of the grip member 470. The grip member 460 defines a slot 462 therethrough adjacent to the side 412 of the door guide 400, and the grip member 470 likewise defines a slog therethrough adjacent to the side 414 of the door guide 400. The slots 462 and 472 are sized to receive therethrough opposing sides 486 and 492 respectively of a latching member 480. The opposing sides 486 and 492 of the latching member 480 are joined by a latch plate 481 which defines an opening 482 therethrough configured to releasably engage the hook member 424 of the latch hook 420 to maintain the door guide 400 in a closed position proximate to or contacting the elongated housing 360.

The door handle 450 further includes an elongated base plate 500 mounted to one side 412 of the door guide 400, and a pair of tabs 485 (only one shown in FIG. 15B) extending from an underside of the side 486 of the latching member 480 engage and ride along an elongated outer edge of the base plate 500. An identical base plate 510 is mounted to the opposite side 414 of the door guide 400, and a pair of tabs 495, identical to the tabs 485, extending from an underside of opposite side 492 of the latching member 480 engage and ride along an elongated outer edge of the base plate 510. A tongue 483 extends rearwardly from a top end of the latch plate 481 and engages a channel 406 defined in a front face 408 of the door guide 400, and an identical tongue (not shown) extends from the bottom end of the latch plate 481 and also engages the channel 406 defined in the front face 408 of the door guide 400. The latching member 480 is mounted to the door guide 400 via engagement of the tabs 485, 495 with the base plates 500, 510 mounted to the door guide 400 and via engagement of the tongues 483 with the channel 406 defined in the front face 408 of the door guide 400.

The latching member 480 is movable upwardly and downwardly relative to the door guide 400 along the channel 406 and along the elongated edges of the base plates 500 and 510 (e.g., a longitudinal axis defined by the door guide 400). Latching projections 484 and 494 extending outwardly away from the opposing sides 486 and 492 respectively of the latching member 480 provide gripping or grasping structures to facilitate manual upward/downward movement of the latching member 480, and projections (not shown) extending outwardly from the elongated edges of the base plates 500 and 510 between each set of tabs 485 and 495 respectively, cooperate with the tabs 485 and 495 to limit the upward and downward travel of the latching member relative to the base plates 500 and 510. In any case, if the terminal end 426 of the hook member 424 is oriented upwardly, it can be captured by the latching member 480 by raising the latching member 480 sufficiently to allow the hook member 424 to enter the opening 482 in the latch plate 481, and then lowering the latching member 480 to trap the terminal end 426 of the hook member 424 along the top edge of the opening 482. If the hook member 424 is oriented downwardly, it can be captured by the latching member 480 by lowering the latching member 480 sufficiently to allow the hook member 24 to enter the opening 482 in the latch plate 481, and then raising the latching member 480 to trap the terminal end 426 of the hook member 424 along the bottom edge of the opening 482.

Figure 15B:
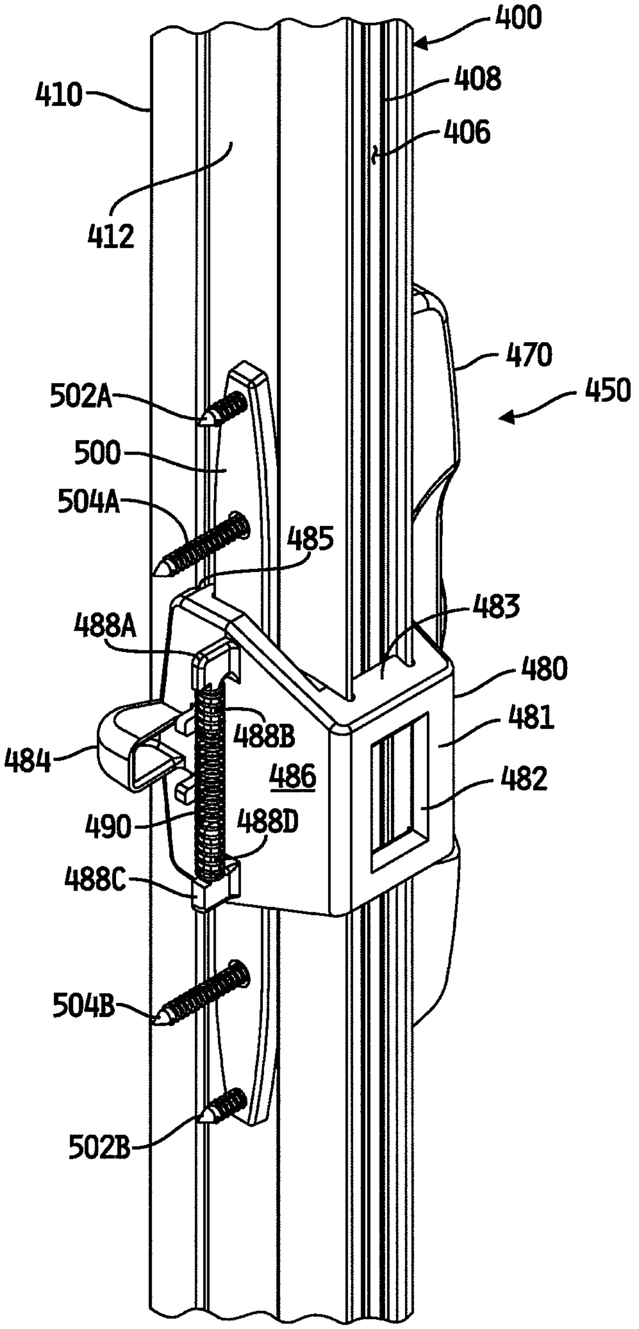
FIG. 15B is a magnified view of the portion of the retractable flexible-panel door similar to FIG. 15A shown with one of the handle grips removed.

On each side of the latching member 480 (only the side 486 is shown in FIG. 15B), a projection 488A extends outwardly and away from the side 486 adjacent to a top end of the side 486, and another projection 488C extends outwardly and away from the side 486 adjacent to a bottom end of the side 486. A terminal end 488B of the projection 488A extends downwardly toward the projection 488C, and a terminal end 488D of the projection 488C extends upwardly toward the projection 488A such that the terminal ends 488B and 488D face each other. A biasing member, e.g., a helical spring, 490 engages and extends between each of the opposing terminal ends 488B, 488D of the projections 488A, 488C.

Figure 15C:
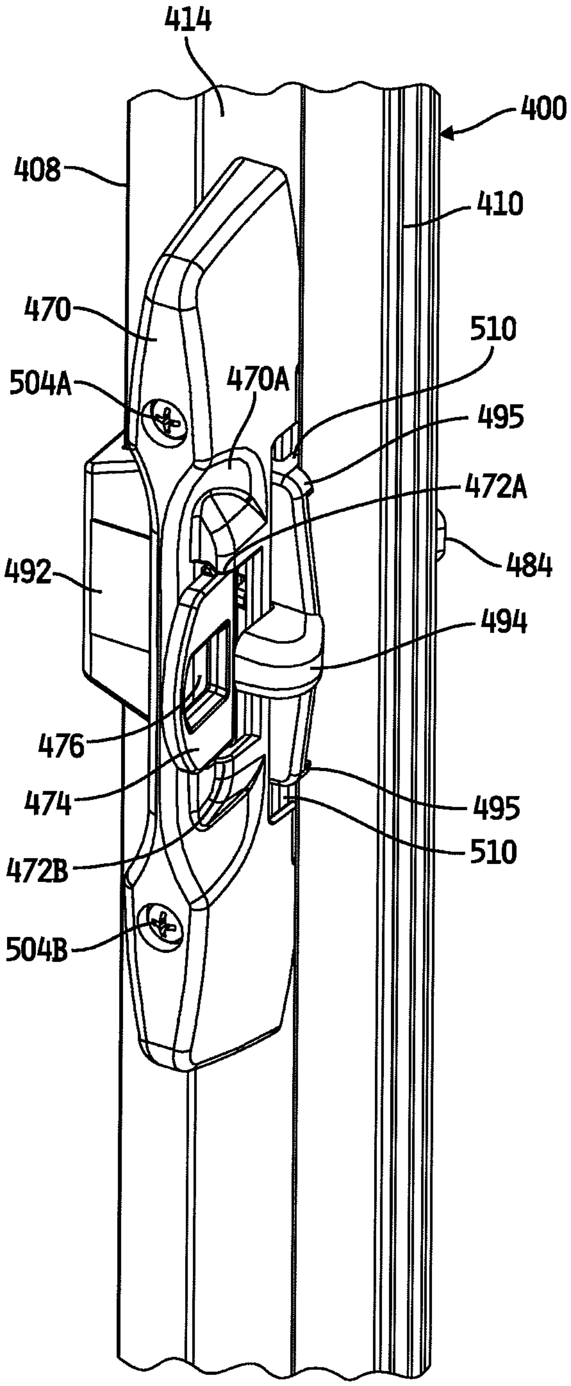
FIG. 15C is a magnified and perspective view of an opposite side of the door handle shown in FIGS. 15A and 15B, illustrating an embodiment of a handle locking feature.

The biasing members 490 on either side of the latching member 480 provide a bi-directional, self-centering mechanism for automatically returning the latching member to a center position as illustrated in FIGS. 15A-15C. In the center position of the latching member 480 illustrated in the drawings, for example, the biasing members 490 are in an equilibrium position with the equal forces applied to opposing ends of each biasing member 490. However, when the latching member 480 is forced upwardly, the ends of the biasing members 490 engaging the projections 488A are compressed upwardly by the grip member 460 (and 470), and when the latching member 480 is thereafter released, the stored energy in the biasing members 490 forces the latching member 480 downwardly until the biasing members 490 return to their equilibrium positions. Likewise, when the latching member 480 is forced downwardly, the ends of the biasing members 490 engaging the projections 488C are compressed downwardly by the grip member 460 (and 470), and when the latching member 480 is thereafter released, the stored energy in the biasing members 490 forces latching member 480 upwardly until the biasing members 490 return to their equilibrium positions.

Figure 15D:
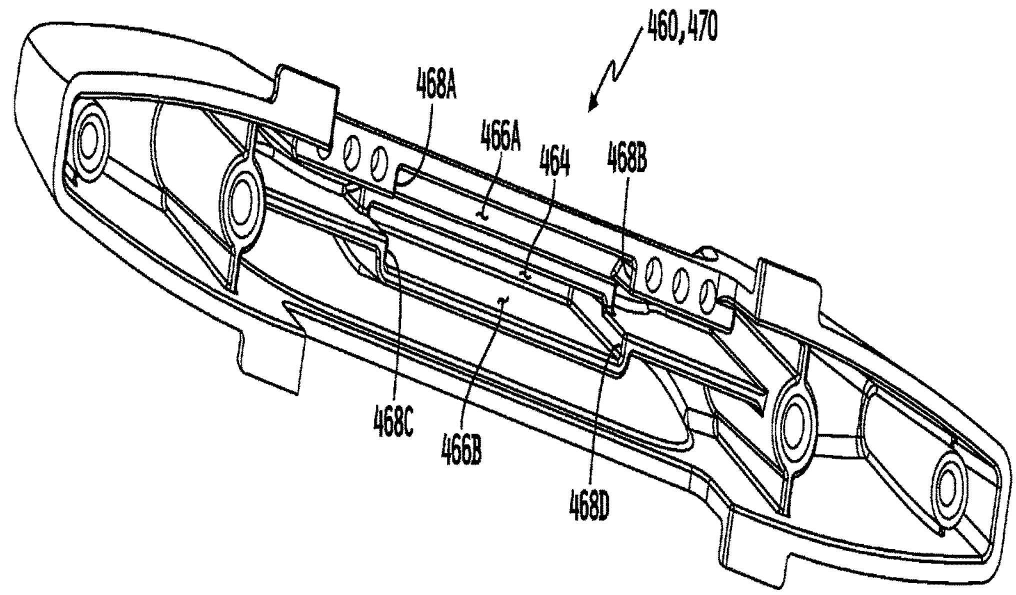
FIG. 15D is a magnified and perspective view of an interior area of one of the handle grips.

Referring specifically to FIG. 15D, an inner area of the grip member 460, 470 is shown which defines a central, longitudinal channel 464 extending therein that is sized to allow unobstructed axial passage of the projections 488A and 488B. Adjacent to each side of the longitudinal channel is a shorter channel 466A, 466B extending parallel with the channel 464. Each channel 466A, 466B terminates at a wall 468A, 468C respectively at one end and at a wall 468B, 468D at an opposite end. The width of the channel 464 is sized to allow passage past the walls 468A, 468C and 468B, 468D of the projections 488A, 488C but not the ends of the biasing member 490 which engage the terminal ends 468A, 468C of the channels 466A, 466B at one end of the biasing member 490 when the latching member 480 is moved in one direction, and which engage the terminal ends 468B, 468D of the channels 466A, 466B at the opposite end of the biasing member 490 when the latching member 480 is moved in the opposite direction. The terminal ends 468A, 468C and 468B, 468D of the channels 466A, 466B acting on the ends of the biasing member 490 when the latching member 480 is moved thus compress the biasing member 490 as described above, thereby resulting in a return of the latching member 480 to its equilibrium position when the latching member 480 is released.

Accordingly, the latch hook 420 is illustratively positioned on the housing 360, and/or the door handle 450 is positioned on the door guide 400, such that the terminal end 426 of the hook member 424 engages the top or bottom edge of the opening 482 in the latch plate when the latching member 480 is in its centered, i.e., equilibrium position. The latching member 480 may then be made to engage the latch hook 420 simply by forcing the latching member 480 upwardly or downwardly, depending upon the orientation of the hook defined at the terminal end 426 of the hook member 424, forcing the door guide 400 into contact with the elongated housing 360 and then releasing the latching member 480. When the latching member 480 is forced by the biasing members 490 back to its equilibrium position, the hook defined at the terminal end 426 of the hook member 424 will engage the top or bottom edge of the opening in the latch plate 482 due to the positioning of the latch hook 420 relative to the latching member 480. The latching member 480 may then be made to disengage the latch hook 420 by reversing the foregoing process.

Referring specifically to FIGS. 15B and 15C, the fixation members 502A and 502B are used to affix the base plates 500 to their respective grip members 460, 470, and the fixation members 504A and 504B are used to affix the grip members 460, 470 together through the door guide 400.

Referring now specifically to FIG. 15C, the door handle 450 further illustratively includes a locking mechanism in the form of a locking ear 474. The locking ear 474 is illustratively pivotably connected to the grip member 470 at top and bottom pivoting connections 472A, 472B respectively, such that the locking ear 474 is pivotable toward and away from the latching projection 494. Illustratively, the locking ear 474 defines an opening 476 therethrough that is sized and configured to receive the latching projection 494 therein when the locking ear 474 is pivoted toward the rear end 410 of the door guide 400. The opening 476 is further sized and configured to block or inhibit the latching projection 494, when the latching projection 494 is received within the opening 476, from sufficient upward or downward movement of the latching member 480 to allow engagement or disengagement the latch hook 420.

Referring now to FIG. 16A, one embodiment of a flexible panel 442 is shown that may be implemented with any embodiment of the flexible-panel door 10, 100 illustrated and described herein. In the illustrated embodiment, the flexible panel 442 is mounted at one end to a rotatable barrel 52, 352 of the type illustrated and described herein, and the opposite end is mounted to a handle 100 or door guide 400 also of the type illustrated and described herein. The flexible panel 442 illustratively includes a base panel 445 of a conventional woven material, e.g., a mesh or netting. Examples of the woven, mesh or netting material that may be used include, but should not be limited to, one or combination of a natural or synthetic fabric such as cloth, canvas, nylon, or the like, one or a combination of synthetic polymers such as polyethylene, polyester or the like, one or a combination of metals or metal compounds such as steel, stainless steel, aluminum, brass, copper, bronze, or the like, and/or any other one or combination of conventional materials used to make woven, mesh or netting materials.

The base panel 445 illustratively has a weave density or strand count that is typical of conventional residential door and/or window mesh screen material, e.g., 12-20 strands per inch, although the base panel 445 may alternatively have a greater or lesser weave density. In the embodiment illustrated in FIG. 16A, horizontal strips 444A, 44B, 444C and 444D of higher weave density mesh material are illustratively added to the base panel 445 for the purpose of providing a visual indicator of the presence of the flexible panel 442, i.e., for the purpose of providing contrast to the flexible panel 442 in order to increase the likelihood of its presence. In one embodiment, the horizontal strips 444A, 444B, 444C and 444D are added to the base panel 445 during the process of fabricating the base panel 442 by selectively increasing the weave densities in the areas of the horizontal strips 444A, 444B, 444C and 444D. Alternatively, the horizontal strips 444A, 444B, 444C and 444D may be added by attaching such higher weave density strips to a prefabricated base panel 445 via one or more conventional flexible panel attachment techniques, such as sewing, use of one or more adhesives, mechanical attachment or the like.

It will be understood that while the flexible panel 442 is shown in FIG. 16A includes four horizontally arranged flexible panels 444A-444D each having a higher weave density than that of the base panel 445, this particular design is provided only way of example and should not be considered to be limiting in any way. Rather, the flexible panel may alternatively include any number of flexible panels having higher weave densities than the base panel 445, which can be arranged in any desired shape and/or extend along any desired direction. Moreover, the weave densities of any such flexible panels added to a base panel 445 need not have the same weave density as long as any such flexible panel added to the base panel 445 has a higher weave density than that of the base panel 445 by an amount that causes the added flexible panel to be visually distinguishable from the base panel.

Referring now to FIG. 16B, another embodiment of a flexible panel 442' is shown that may be implemented with any embodiment of the flexible-panel door 10, 100 illustrated and described herein. In the illustrated embodiment, the flexible panel 442' is, like the flexible panel 442 of FIG. 16A, mounted at one end to a rotatable barrel 52, 352 of the type illustrated and described herein, and the opposite end to a handle 100 or door guide 400 also of the type illustrated and described herein. The flexible panel 442' also illustratively includes a base panel 445 of a conventional woven material, e.g., a mesh or netting to which a of spaced apart, horizontal strips 446A and 446B of higher weave density mesh material have been added for the purpose of providing a visual indicator of the presence of the flexible panel 442. In the embodiment illustrated in FIG. 16B, additional horizontal strips 448A and 448 of higher weave density mesh material have been added along the top and bottom respectively of the base panel 445 for the purpose of adding stiffness to these areas of the base panel 445 in order to reduce the likelihood that the top and/or bottom edges of the resulting flexible panel 442 will bind, buckle, fray or catch on the top or bottom rails of the flexible panel door 10, 10', 100.

It should be noted that each of the embodiments illustrated in FIGS. 16A and 16B include one or more duplicate strips spaced approximately the same distance away from the horizontal midline of the base panel 445. While this particular feature has the benefit of providing visual indicators of the flexible panel 442, 442' in two separate zones of the panel 442, 442', it also facilitates invertible mounting of the door guide 400 and side rail 330 to the top and bottom rails 336, 334 respectively, thus further accommodating reversible mounting of the door 100 within a doorway 12, e.g., right hand or left hand opening of the flexible panel door 100 relative to the doorway 12.

It should now be apparent from the foregoing that the flexible panel door 10, 10', 100 illustrated and described herein is easily mountable to a conventional doorway 12, and can easily be configured to fit various width doorways 12 without modifying any of its structural components. In the embodiment illustrated in FIGS. 11-15C, for example, the flexible panel door 100 can be quickly and easily mounted to a conventional doorway 12 simply by affixing, e.g., with conventional nails or screws, the side rails 330, 332 to opposite sides of the doorway 12. Because neither the top rail 336 nor the bottom rail 334 are affixed in their lateral directions to the doorway 12, installation in various-width doorways 12 is made simple as one need only affix the side rail 330, 332 of the assembly to one side the doorway 12 and then simply extend the side rail 330, 332 to the opposite side of the doorway 12. The lengths of the top and bottom rails 336 and 334 will automatically adjust as the unmounted side rail 330, 332 is moved toward the opposite side of the doorway 12 since neither of the top or bottom rails 336 and 334, nor any of the end caps 372, 374, 392, 394, are initially affixed directly to any part of the doorway. While the sill plate 38 may be affixed to a threshold or an area of the floor surrounding the doorway 12, this may typically be done as a last step, i.e., after the side rails 330, 332 are affixed to the doorway 12. Moreover, because the bottom center rail 370 is still movable in its axial direction relative to the center sill plate 80 with the center sill plate 80 secured to an underlying structure, such anchoring of the sill plate 80 generally will not impede or affect the mounting of the side rails 330, 332 to the doorway 12.

It should further be apparent that the various components making up the flexible panel door 100 are specifically configured to facilitate invertible mounting of the flexible panel door 100 to a doorway 12 without modifying or reconfiguring any of its components. For example, the side rails 330, 332 are invertible and therefore each is configured to be mounted to either side of a doorway 12. Additionally, engagement of the top rail member 390 with the end caps 392, 394 is illustratively identical to engagement of the bottom rail member 370 with the end caps 372, 374, so that the top rail member 370 and bottom rail member 390 may be interchangeably connected end cap pairs 372, 374 and 392, 394. Moreover, the top rail member 336 and the bottom rail member 334 are substantially identical such that the sill plate 38 may be mounted to either. And because the door handle 450 is bi-directional and self-centering, it can accommodate both left-hand and right-hand open/close configurations without modification. Further still, because the areas of increased weave density on the flexible panel 442 are illustratively symmetric about its horizontal midline it too can accommodate invertible mounting without modification.

Figure 17:
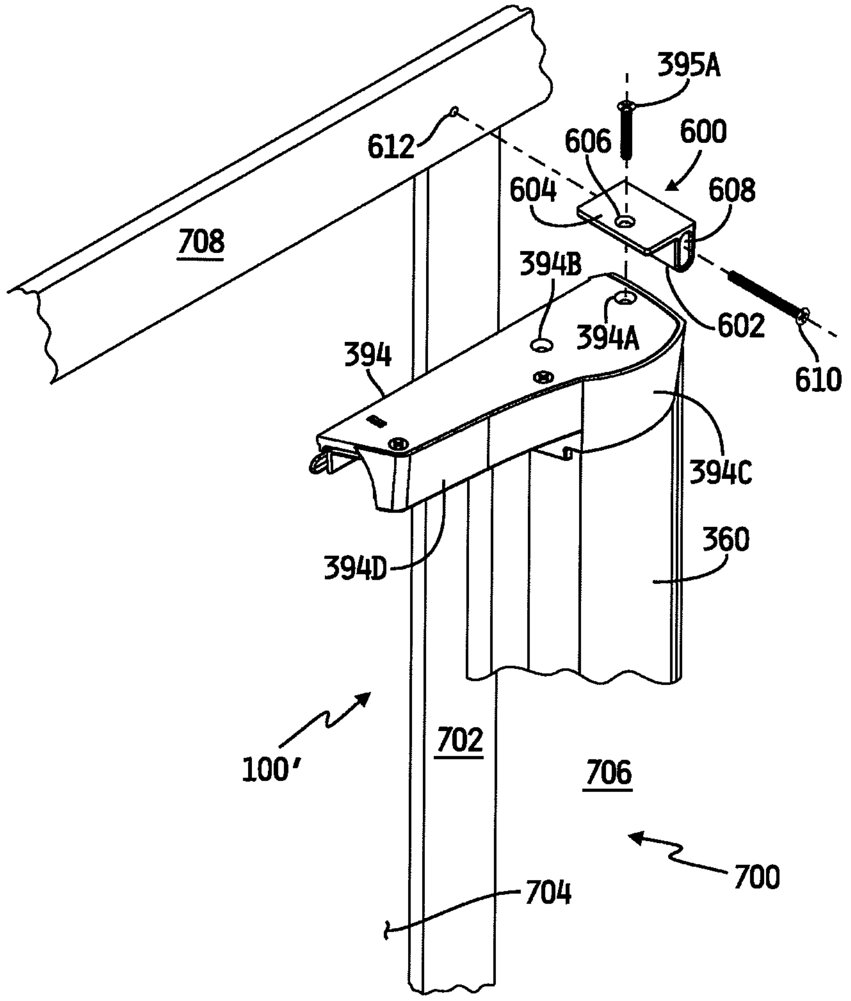
FIG. 17 is a magnified view similar to FIG. 13A illustrating of the portion of an alternate embodiment of the retractable flexible-panel door of FIG. 11.

Referring now to FIG. 17, a portion of an alternate embodiment 100' of the retractable flexible-panel door is shown configured for mounting to a doorway, e.g., such as a doorway to which a conventional sliding door or single-opening French door may be mounted, that does not include conventional brick molding 20 of the type illustrated and described. In the illustrated embodiment, for example, the doorway has a conventional sliding door 700 mounted thereto which illustratively includes a center post 702 separating a movable door panel 704 and a stationary door panel 706, and a top molding 708 extending over both panels 704, 706. In this embodiment, or in other embodiments in which it is not possible or practical to mount the side rails 330, 332 of the door 100 to a conventional brick molding 20 as described above, the door 100 may be modified to form a door 100' which has mounting brackets 600 attached to one or all of the end caps 372, 374, 392, 394. Illustratively, the mounting bracket 600 is an L-shaped bracket having a side plate 602 oriented at a right angle relative to a top plate 604. A bore 606 is defined through the top plate 604, and is sized to receive therethrough a fixation member such as the fixation member 395A described above. The mounting bracket 600 may thus be mounted and secured to an end cap, e.g., end cap 394, by passing the fixation member 395A through the bore 606 and into engagement with the bore 394A defined in the end cap 394. The side plate 602 defines another bore 608 oriented orthogonally relative to the bore 606, and is sized to receive another fixation member, e.g., fixation member 610. The fixation member 610 may be passed through the bore 608 and secured to a suitable location of the door 700, e.g., securement point 612, to secure the end cap 394 to the door 700. Similar brackets 600 may be used to secure one or more of the remaining end caps 372, 274, 392 to suitable locations of the door 700 or other suitable structure surrounding the door 700. In such embodiments, a modified central sill plate may be used that is, for example, similar to the central sill plate 80 described above with the exception that it may not be pivotable relative to the bottom rail member 370.

While the invention has been illustrated and described in detail in the foregoing drawings and description, the same is to be considered as illustrative and not restrictive in character, it being understood that only illustrative embodiments thereof have been shown and described and that all changes and modifications that come within the spirit of the invention are desired to be protected. For example, in some of the embodiments illustrated and described herein, the retractable flexible-panel door 10 may alternatively include one or more constant-force biasing members acting only on one side of a handle of the door 10 in order to maintain constant force applied by the one or more such biasing members on the handle 40 along the entire length of travel of the handle 40 between the two sides 30, 32 of the door 10. As another example, in any of the embodiments illustrated and described herein, the retractable flexible panel door 10 may alternatively omit the side rail 32. In some such embodiments, a biasing member may be carried by either or both of the top and bottom rails 34, 36 adjacent its free end and coupled to one side of the handle 40 to counterbalance biasing forces applied to the opposite side of the handle 40 by one or more other biasing members. In other such embodiments, biasing members may be used only to apply biasing forces to only one side of the handle 40.

What is claimed is:

1. A retractable, flexible-panel door mountable to a door frame attached to a building, comprising:

a first side rail mountable to one side of the door frame, a second side rail mountable to an opposite side of the door frame, a top rail including a first end cap affixable to one end of the first side rail, a second end cap affixable to one end of the second side rail and an elongated top rail member extendable along a top of the door frame between the first and second end caps, the first end cap defining a first channel extending toward the second end cap and slidably receiving one end of the elongated top rail member therein and the second end cap defining a second channel extending toward the first end cap and slidably receiving an opposite end of the elongated top rail member therein, the first and second end caps and the top rail member together configured to define an axial length of the top rail between the first and second side rails that is adjustable between a minimum length in which the opposing ends of the elongated top rail member extend a first distance into the first and second channels relative to distal ends of the first and second channels and a maximum length in which the opposing ends of the elongated top rail member extend a second distance into the first and second channels relative to the distal ends thereof, the second distance less than the first distance, a bottom rail including a third end cap affixable to an opposite end of the first side rail, a fourth end cap affixable to an opposite end of the second side rail and an elongated bottom rail member extendable along a bottom of the door frame between the third and fourth end caps, the third end cap defining a third channel extending toward the fourth end cap and slidably receiving one end of the elongated bottom rail member therein and the fourth end cap defining a fourth channel extending toward the third end cap and slidably receiving an opposite end of the elongated bottom rail member therein, the third and fourth end caps and the bottom rail member together configured to define an axial length of the bottom rail between the first and second side rails that is adjustable between a minimum length in which the opposing ends of the elongated bottom rail member extend a third distance into the third and fourth channels relative to distal ends of the third and fourth channels and a maximum length in which the opposing ends of the elongated bottom rail member extend a fourth distance into the third and fourth channels relative to the distal ends thereof, the fourth distance less than the third distance, a flexible panel extending between the top and bottom rails, and at least one biasing member to draw the flexible panel toward one of the first and second side rails.

2. The retractable, flexible-panel door of claim 1, further comprising a sill plate attachable to the bottom rail, the sill plate including a center sill plate attachable to the bottom rail, a first sill extension slidably engageable with the center sill plate adjacent one side thereof and a second sill extension slidably engageable with the center sill plate adjacent an opposite side thereof, the first and second sill extensions each slidably positionable relative to the center sill plate to extend across the axial length of the bottom rail.

3. The retractable, flexible-panel door of claim 1, wherein the at least one biasing member comprises a single biasing member carried by one of the first and second side rails.

4. The retractable, flexible panel door of claim 1, further comprising an elongated barrel, wherein the one of the first and second side rails extend about the elongated barrel, wherein one side of the flexible panel is attached to the elongated barrel at least partially along a length thereof, and wherein the at least one biasing member biases the barrel to rotate in a direction that draws the flexible panel toward the one of the first and second side rails and takes up the flexible panel on the elongated barrel.

5. The retractable, flexible-panel door of claim 1, wherein the first side rail is also mountable to the opposite side of the door frame, the second side rail is also mountable to the one side of the door frame, the top rail is also mountable to and between the first and second side rails along the bottom of the door frame, and the bottom rail is also mountable to and between the first and second rails along the top of the door frame, and wherein the first side rail, the second side rail, the top rail and the bottom rail are together mountable in either of a first configuration, with the first side rail mounted to the one side of the door frame, the second side rail mounted to the opposite side of the door frame, the top rail mounted to and between the first and second side rails along the top of the door frame and the bottom rail mounted to and between the first and second side rails along the bottom of the door frame, and a second configuration with the first side rail mounted to the opposite side of the door frame, the second side rail mounted to the one side of the door frame, the top rail mounted to and between the first and second side rails along the bottom of the door frame and the bottom rail mounted to and between the first and second side rails along the top of the door frame.

6. The retractable, flexible panel door of claim 1, wherein the first channel defines a first notched portion between the distal end and a proximal end thereof and the elongated top rail defines a first notched portion spaced apart from the one end thereof, wherein the second channel defines a second notched portion between the distal end and a proximal end thereof and the elongated top rail defines a second notched portion spaced apart from the opposite end thereof, and wherein the first notched portion of the elongated top rail abuts the first notched portion of the first channel when the one end of the elongated top rail extends the first distance into the first channel relative to the distal end thereof and the second notched portion of the elongated top rail abuts the second notched portion of the second channel when the opposite end of the elongated top rail extends the first distance into the second channel relative to distal end thereof.

7. The retractable, flexible panel door of claim 6, wherein the first notched portion of the first channel is positioned at or near the distal end of the first channel when the one end of the elongated top rail extends the second distance into the first channel relative to the distal end thereof and the second notched portion of the second channel is positioned at or near the distal end of the second channel when the opposite end of the elongated top rail extends the second distance into the second channel relative to distal end thereof.

8. The retractable, flexible panel door of claim 7, wherein the third channel defines a third notched portion between the distal end and a proximal end thereof and the elongated bottom rail defines a third notched portion spaced apart from the one end thereof, wherein the fourth channel defines a fourth notched portion between the distal end and a proximal end thereof and the elongated bottom rail defines a fourth notched portion spaced apart from the opposite end thereof, and wherein the third notched portion of the elongated bottom rail abuts the third notched portion of the third channel when the one end of the elongated bottom rail extends the third distance into the third channel relative to the distal end thereof and the fourth notched portion of the elongated bottom rail abuts the fourth notched portion of the fourth channel when the opposite end of the elongated bottom rail extends the third distance into the fourth channel relative to distal end thereof.

9. The retractable, flexible panel door of claim 8, wherein the third notched portion of the third channel is positioned at or near the distal end of the third channel when the one end of the elongated bottom rail extends the fourth distance into the third channel relative to the distal end thereof and the fourth notched portion of the fourth channel is positioned at or near the distal end of the fourth channel when the opposite end of the elongated bottom rail extends the fourth distance into the fourth channel relative to distal end thereof.

10. A retractable, flexible-panel door mountable to a door frame attached to a building, comprising:

a first side rail mountable to one side of the door frame, a second side rail mountable to an opposite side of the door frame, a top rail including a first end cap affixable to one end of the first side rail, a second end cap affixable to one end of the second side rail and an elongated top rail member extendable along a top of the door frame between the first and second end caps, the first and second end caps defining therein opposing first and second channels respectively, the elongated top rail member slidably received within each of the first and second channels, the first and second end caps and the top rail member together configured to define an axial length of the top rail between the first and second side rails that is adjustable between a minimum length in which the opposite portions of the elongated top rail member are at or near proximal ends of the first and second channels and a maximum length in which the opposite portions of the elongated top rail member are spaced apart from the proximal ends of the first and second channels, a bottom rail including a third end cap affixable to an opposite end of the first side rail, a fourth end cap affixable to an opposite end of the second side rail and an elongated bottom rail member extendable along a bottom of the door frame between the third and fourth end caps, the third and fourth end caps defining therein opposing third and fourth channels respectively, the elongated bottom rail member slidably received within each of the third and fourth channels, the third and fourth end caps and the bottom rail member together configured to define an axial length of the bottom rail between the third and fourth side rails that is adjustable between a minimum length in which the opposite portions of the elongated bottom rail member are at or near proximal ends of the third and fourth channels and a maximum length in which the opposite portions of the elongated bottom rail member spaced apart from the proximal ends of the third and fourth channels, a flexible panel extending between the top and bottom rails, and at least one biasing member to draw the flexible panel toward one of the first and second side rails.

11. The retractable, flexible-panel door of claim 10, wherein the first side rail is also mountable to the opposite side of the door frame, the second side rail is also mountable to the one side of the door frame, the top rail is also mountable to and between the first and second side rails along the bottom of the door frame, and the bottom rail is also mountable to and between the first and second rails along the top of the door frame, and wherein the first side rail, the second side rail, the top rail and the bottom rail are together mountable in either of a first configuration, with the first side rail mounted to the one side of the door frame, the second side rail mounted to the opposite side of the door frame, the top rail mounted to and between the first and second side rails along the top of the door frame and the bottom rail mounted to and between the first and second side rails along the bottom of the door frame, and a second configuration with the first side rail mounted to the opposite side of the door frame, the second side rail mounted to the one side of the door frame, the top rail mounted to and between the first and second side rails along the bottom of the door frame and the bottom rail mounted to and between the first and second side rails along the top of the door frame.

12. The retractable, flexible-panel door of claim 10, further comprising a sill plate attachable to the bottom rail, the sill plate including a center sill plate attachable to the bottom rail, a first sill extension slidably engageable with the center sill plate adjacent one side thereof and a second sill extension slidably engageable with the center sill plate adjacent an opposite side thereof, the first and second sill extensions each slidably positionable relative to the center sill plate to extend across the axial length of the bottom rail.

13. The retractable, flexible panel door of claim 10, further comprising an elongated barrel, wherein the one of the first and second side rails extend about the elongated barrel, wherein one side of the flexible panel is attached to the elongated barrel at least partially along a length thereof, and wherein the at least one biasing member biases the barrel to rotate in a direction that draws the flexible panel toward the one of the first and second side rails and takes up the flexible panel on the elongated barrel.

14. The retractable, flexible panel door of claim 13, further comprising:

an elongated door guide movably coupled to and between the top and bottom rails, wherein an opposite side of the flexible panel is attached to the elongated door guide at least partially along a length thereof and a door handle mounted to the elongated door guide, the door handle having a latching member to secure the elongated door guide to the other of the first and second side rails.

15. The retractable, flexible-panel door of claim 10, wherein the first side rail defines a first axial direction between the one end thereof and the opposite end thereof, the retractable flexible-panel door further comprising:

a first bracket mountable to the first end cap along the first axial direction and defining a first bore therethrough oriented orthogonally to the first axial direction, a second bracket mountable to the third end cap along the first axial direction and defining a second bore therethrough oriented orthogonally to the first axial direction, and first and second fixation members each extendable through a respective one of the first and second bores and engageable with a molding surrounding the door frame.

16. The retractable, flexible-panel door of claim 15, wherein the second side rail defines a second axial direction between the one end thereof and the opposite end thereof, the retractable flexible-panel door further comprising:

a third bracket mountable to the second end cap along the second axial direction and defining a third bore therethrough oriented orthogonally to the second axial direction, a fourth bracket mountable to the fourth end cap along the second axial direction and defining a fourth bore therethrough oriented orthogonally to the second axial direction, and third and fourth fixation members each extendable through a respective one of the third and fourth bores and engageable with a molding surrounding the door frame.

17. A retractable, flexible-panel door mountable to a door frame attached to a building, comprising:

a first side rail mountable to one side of the door frame, a second side rail mountable to an opposite side of the door frame, a top rail including a first end cap affixable to one end of the first side rail, a second end cap affixable to one end of the second side rail and an elongated top rail member extendable along a top of the door frame between the first and second end caps, one of the first end cap and one end of the elongated top rail member defining a first channel configured to slidingly receive therein at least a portion of the other of the first end cap and the one end of the elongated top rail member, one of the second end cap and an opposite end of the elongated top rail member defining a second channel configured to slidingly receive therein at least a portion of the other of the second end cap and the opposite end of the elongated top rail member, the first and second end caps and the top rail member together configured to define an axial length of the top rail between the first and second side rails that is adjustable between a minimum length in which a distal end of the at least a portion of the other of the first end cap and the one end of the elongated top rail member extends a first distance into the first channel relative to a distal end of the first channel and a distal end of the at least a portion of the other of the second end cap and the opposite end of the elongated top rail member extends the first distance into the second channel relative to a distal end of the second channel, and a maximum length in which the distal end of the at least a portion of the other of the first end cap and the one end of the elongated top rail member extends a second distance into the first channel relative to the distal end of the first channel and the distal end of the at least a portion of the other of the second end cap and the opposite end of the elongated top rail member extends the second distance into the second channel relative to the distal end of the second channel, the second distance less than the first distance, a bottom rail including a third end cap affixable to an opposite end of the first side rail, a fourth end cap affixable to an opposite end of the second side rail and an elongated bottom rail member extendable along a bottom of the door frame between the third and fourth end caps, one of the third end cap and one end of the elongated bottom rail member defining a third channel configured to slidingly receive therein at least a portion of the other of the third end cap and the one end of the elongated bottom rail member, one of the fourth end cap and an opposite end of the elongated bottom rail member defining a fourth channel configured to slidingly receive therein at least a portion of the other of the fourth end cap and the opposite end of the elongated bottom rail member, the third and fourth end caps and the bottom rail member together configured to define an axial length of the bottom rail between the third and fourth side rails that is adjustable between a minimum length in which a distal end of the at least a portion of the other of the third end cap and the one end of the elongated bottom rail member extends a third distance into the third channel relative to a distal end of the third channel and a distal end of the at least a portion of the other of the fourth end cap and the opposite end of the elongated bottom rail member extends the third distance into the fourth channel relative to a distal end of the fourth channel, and a maximum length in which the distal end of the at least a portion of the other of the third end cap and the one end of the elongated bottom rail member extends a fourth distance into the third channel relative to the distal end of the third channel and the distal end of the at least a portion of the other of the fourth end cap and the opposite end of the elongated bottom rail member extends the fourth distance into the fourth channel relative to the distal end of the fourth channel, the fourth distance less than the third distance, a flexible panel extending between the top and bottom rails, and at least one biasing member to draw the flexible panel toward one of the first and second side rails.

18. The retractable, flexible-panel door of claim 17, further comprising a sill plate attachable to the bottom rail, the sill plate including a center sill plate attachable to the bottom rail, a first sill extension slidably engageable with the center sill plate adjacent one side thereof and a second sill extension slidably engageable with the center sill plate adjacent an opposite side thereof, the first and second sill extensions each slidably positionable relative to the center sill plate to extend across the axial length of the bottom rail.

19. The retractable, flexible-panel door of claim 17, further comprising further comprising an elongated barrel extending between and rotatably coupled to the first and third end caps, and an elongated door guide movably coupled to and between the top and bottom rails, wherein one side of the flexible panel is attached to the elongated barrel at least partially along a length thereof and an opposite side of the flexible panel is attached to the elongated door guide at least partially along a length thereof, and wherein the at least one biasing member biases the barrel to rotate in a direction that draws the flexible panel toward the one of the first and second side rails and takes up the flexible panel on the elongated barrel.

20. The retractable, flexible-panel door of claim 17, wherein the first side rail is also mountable to the opposite side of the door frame, the second side rail is also mountable to the one side of the door frame, the top rail is also mountable to and between the first and second side rails along the bottom of the door frame, and the bottom rail is also mountable to and between the first and second rails along the top of the door frame, and wherein the first side rail, the second side rail, the top rail and the bottom rail are together mountable in either of a first configuration with the first side rail mounted to the one side of the door frame, the second side rail mounted to the opposite side of the door frame, the top rail mounted to and between the first and second side rails along the top of the door frame and the bottom rail mounted to and between the first and second side rails along the bottom of the door frame, and a second configuration with the first side rail mounted to the opposite side of the door frame, the second side rail mounted to the one side of the door frame, the top rail mounted to and between the first and second side rails along the bottom of the door frame and the bottom rail mounted to and between the first and second side rails along the top of the door frame.

* * * * *